(12) United States Patent
Kim et al.

(10) Patent No.: US 11,925,077 B2
(45) Date of Patent: Mar. 5, 2024

(54) DISPLAY APPARATUS

(71) Applicant: Samsung Display Co., Ltd., Yongin-si (KR)

(72) Inventors: Byoung Yong Kim, Seoul (KR); Bong Hyun You, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 596 days.

(21) Appl. No.: 17/266,822

(22) PCT Filed: Mar. 18, 2019

(86) PCT No.: PCT/KR2019/003077
§ 371 (c)(1),
(2) Date: Feb. 8, 2021

(87) PCT Pub. No.: WO2020/032340
PCT Pub. Date: Feb. 13, 2020

(65) Prior Publication Data
US 2021/0351262 A1 Nov. 11, 2021

(30) Foreign Application Priority Data
Aug. 9, 2018 (KR) ........................ 10-2018-0093249

(51) Int. Cl.
*H01L 23/00* (2006.01)
*H10K 59/131* (2023.01)
*H10K 59/88* (2023.01)

(52) U.S. Cl.
CPC ........... *H10K 59/131* (2023.02); *H10K 59/88* (2023.02)

(58) Field of Classification Search
CPC ............................. H10K 59/131; H10K 59/88
See application file for complete search history.

(56) References Cited

U.S. PATENT DOCUMENTS

| | | | |
|---|---|---|---|
| 5,734,226 | A | 3/1998 | Cathey |
| 2005/0099565 | A1 | 5/2005 | Shin et al. |
| 2007/0126090 | A1 | 6/2007 | Sasaki et al. |
| 2008/0151170 | A1 | 6/2008 | Oh et al. |
| 2010/0201661 | A1 | 8/2010 | Kimura et al. |
| 2013/0027282 | A1 | 1/2013 | Kimura et al. |

(Continued)

FOREIGN PATENT DOCUMENTS

| | | |
|---|---|---|
| JP | 2005-223054 A | 8/2005 |
| JP | 2007-73817 A | 3/2007 |

(Continued)

OTHER PUBLICATIONS

EPO Extended Search Report dated Apr. 7, 2022, for corresponding European Patent Application No. 19847700.2 (8 pages).

(Continued)

*Primary Examiner* — Anthony Ho
(74) *Attorney, Agent, or Firm* — Lewis Roca Rothgerber Christie LLP

(57) ABSTRACT

A display apparatus includes: a display panel including a display area, and a pad area adjacent to the display area; and a circuit board attached to the pad area. The pad area includes at least one signal pad terminal electrically connected to a first signal line extending through the display area, and at least one dummy pad terminal spaced from the first signal line. The circuit board includes a signal lead terminal connected to the signal pad terminal, and a dummy lead terminal connected to the dummy pad terminal.

20 Claims, 17 Drawing Sheets

(56) References Cited

U.S. PATENT DOCUMENTS

| | | |
|---|---|---|
| 2017/0031199 A1 | 2/2017 | Kimura et al. |
| 2017/0357122 A1 | 12/2017 | Of |
| 2017/0365653 A1 | 12/2017 | Kim et al. |
| 2018/0110122 A1 | 4/2018 | Lee |
| 2018/0174952 A1 | 6/2018 | Kim et al. |
| 2018/0182839 A1 | 6/2018 | Lee et al. |
| 2019/0219859 A1 | 7/2019 | Kimura et al. |
| 2021/0109395 A1 | 4/2021 | Kimura et al. |

FOREIGN PATENT DOCUMENTS

| | | |
|---|---|---|
| JP | 2007-86409 A | 4/2007 |
| JP | 2007-158001 A | 6/2007 |
| JP | 2012-83769 A | 4/2012 |
| JP | 2016-75896 A | 5/2016 |
| KR | 10-0188103 B1 | 6/1999 |
| KR | 10-2005-0044183 A | 5/2005 |
| KR | 10-2005-0111961 A | 11/2005 |
| KR | 10-2008-0019985 A | 3/2008 |
| KR | 10-0920354 B1 | 10/2009 |
| KR | 10-1324554 B1 | 11/2013 |

OTHER PUBLICATIONS

International Search Report dated Jun. 24, 2019, for corresponding Application No. PCT/KR2019/003077 filed Mar. 18, 2019, 4 pages.

FIG. 16
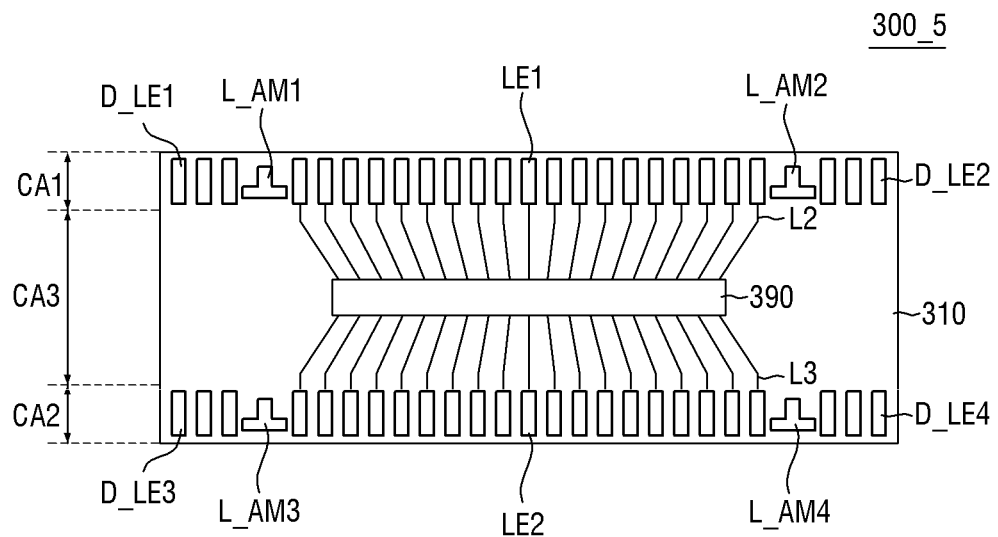
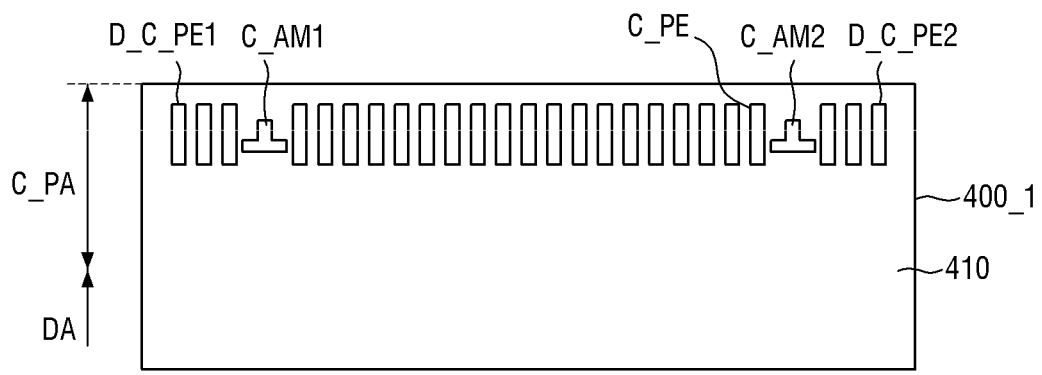
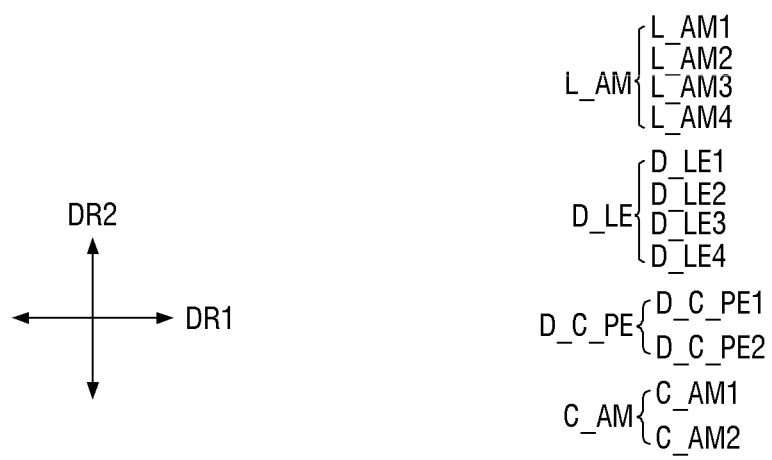

DISPLAY APPARATUS

CROSS-REFERENCE TO RELATED APPLICATION

This application is a U.S. National Phase Patent Application of International Application No. PCT/KR2019/003077, filed on Mar. 18, 2019, which claims priority to Korean Patent Application No. 10-2018-0093249, filed on Aug. 9, 2018, the entire content of all of which is incorporated by reference herein.

TECHNICAL FIELD

Aspects of embodiments of the present disclosure relate to a display apparatus.

BACKGROUND ART

A display apparatus is an apparatus for visually displaying data. Such a display apparatus includes a substrate that is partitioned into a display area and a non-display area. A plurality of pixels are disposed on the substrate in the display area, and a plurality of pads and the like are disposed on the substrate in the non-display area. A flexible film (COF Film) or the like on which a driving circuit or the like is mounted is coupled to the plurality of pads to transmit a driving signal to the pixels.

The flexible film may include a plurality of leads connected to the plurality of pads, and each lead may be bonded to pads that are separated (e.g., that are spaced apart) from each other. The bonding may be performed by an ultrasonic bonding process.

However, when an adhesion portion that is attached to the pad of the flexible film is not formed to have a sufficient area, adhesion between the flexible film and the non-display area on which the pad is disposed may not have a suitable strength (e.g., may be weak).

The above information disclosed in this Background Art section is for enhancement of understanding of the background of the present disclosure, and therefore, it may contain information that does not constitute prior art.

DISCLOSURE

Technical Problem

One or more embodiments of the present disclosure are directed to a display apparatus that may increase adhesion between a display panel and a flexible printed circuit film.

However, the aspects and features of the present disclosure are not limited to the above-mentioned technical problems, and other aspects and features of the present disclosure will be clearly understood by those skilled in the art from the following description.

Technical Solution

One aspect of the present disclosure provides a display apparatus including: a display panel including a display area, and a pad area disposed around the display area; and a circuit board attached to the pad area. The pad area includes at least one signal pad terminal electrically connected to a first signal line passing through the display area, and at least one dummy pad terminal separated from the first signal line. The circuit board includes a signal lead terminal connected to the signal pad terminal, and a dummy lead terminal connected to the dummy pad terminal.

The circuit board may further include a driving integrated circuit, and a second signal line electrically connecting the driving integrated circuit and the signal lead terminal to each other.

The dummy pad terminal may be separated from the driving integrated circuit.

The signal pad terminal and the dummy pad terminal may be directly connected to each other.

The signal pad terminal may be provided in plural, and the plurality of signal pad terminals may be arranged along a first direction.

The at least one dummy pad terminal may include a first dummy pad terminal disposed on one side of an array of the plurality of signal pad terminals in the first direction.

The at least one dummy pad terminal may further include a second dummy pad terminal disposed on the other side of the array of the plurality of signal pad terminals in the first direction.

The display panel may include a first pad alignment mark disposed between the array of the plurality of signal pad terminals and the first dummy pad terminal, and a second pad alignment mark disposed between the array of the plurality of signal pad terminals and the second dummy pad terminal, and the first and second pad alignment marks may have a shape that is different from that of the signal pad terminal.

The circuit board may include a first lead alignment mark directly connected to the first pad alignment mark, and a second lead alignment mark directly connected to the second pad alignment mark.

A planar size of the first pad alignment mark may be the same as that of the first lead alignment mark, and a planar size of the second pad alignment mark may be the same as that of the second lead alignment mark.

The dummy pad terminal may include a first material selected from among Ti/Al/Ti, Mo/Al/Mo, Mo/AlGe/Mo, and Ti/Cu.

The dummy lead terminal may include a second material selected from among Ag, Au, and Cu.

A region in which the first material and the second material are mixed with each other may be included between the dummy pad terminal and the dummy lead terminal.

A sum of a thickness of the signal pad terminal and a thickness of the signal lead terminal may be equal to a sum of a thickness of the dummy pad terminal and a thickness of the dummy lead terminal.

A planar size of the dummy pad terminal may be larger than a planar size of the dummy lead terminal.

The dummy pad terminal may include a first area overlapping with the dummy lead terminal in a thickness direction, and a second area disposed around the first area.

The dummy pad terminal and the dummy lead terminal may be directly connected to each other in the first area.

The dummy pad terminal and the dummy lead terminal may be ultrasonically bonded to each other in the first area.

The dummy pad terminal may further include a scratch in the second area on one surface facing the circuit board.

A first roughness of one surface of the dummy pad terminal in the first area may be smaller than a second roughness of one surface of the dummy pad terminal in the second area.

Specific matters of other embodiments are included in the detailed description and the drawings.

Advantageous Effects

According to one or more embodiments of the present disclosure, a display apparatus may be provided that may increase adhesion between a display panel and a flexible printed circuit film.

However, the aspects and features of the present disclosure are not limited to those discussed above, and various additional aspects and features are included in the present specification.

DESCRIPTION OF DRAWINGS

The above and other aspects and features of the present disclosure will become more apparent to those skilled in the art from the following detailed description of the example embodiments with reference to the accompanying drawings.

FIG. 16 is a plan layout view of first and second circuit boards according to another embodiment.

MODES OF THE INVENTION

Aspects and features of the present disclosure, and methods for achieving the same, will be apparent with reference to the embodiments described below in detail with reference to the accompanying drawings. However, the present disclosure is not limited to the embodiments disclosed below, and may be implemented in various different forms. In other words, the present disclosure is defined by the scope of the claims, and their equivalents.

When an element or layer is referred to as being "above" or "on" another element or layer, the element or layer may be directly on the other element or layer, or one or more intervening elements or layers may be present therebetween. On the other hand, when an element or layer is referred to as being "directly on" or "directly above" another element or layer, no intervening elements or layers may be present therebetween.

The same reference symbols are used to refer to the same or substantially the same (or similar) parts throughout the specification.

Hereinafter, embodiments of the present disclosure will be described in more detail with reference to the drawings.

Figure 1:
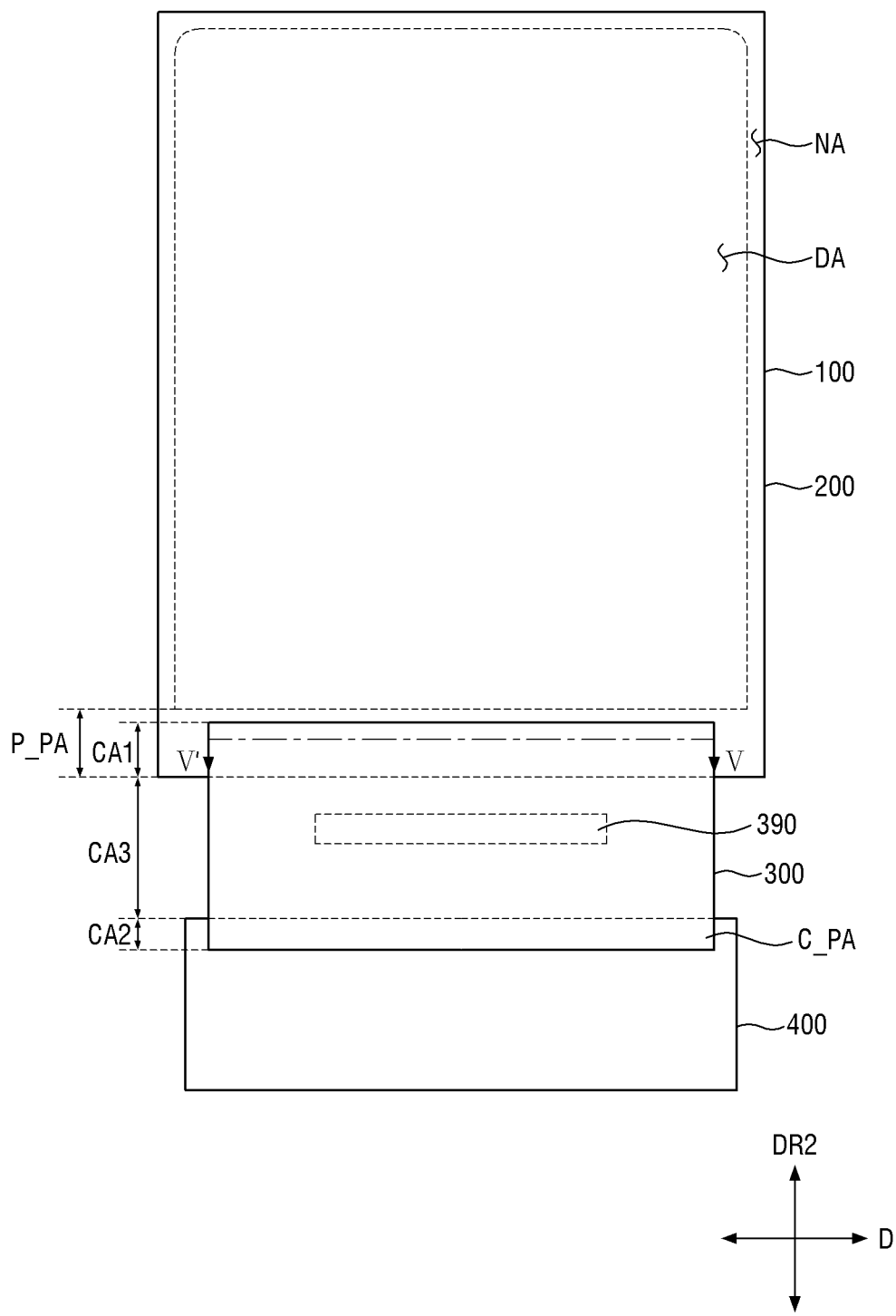
FIG. 1 is a plan layout view of a display apparatus according to an embodiment.
Figure 2:
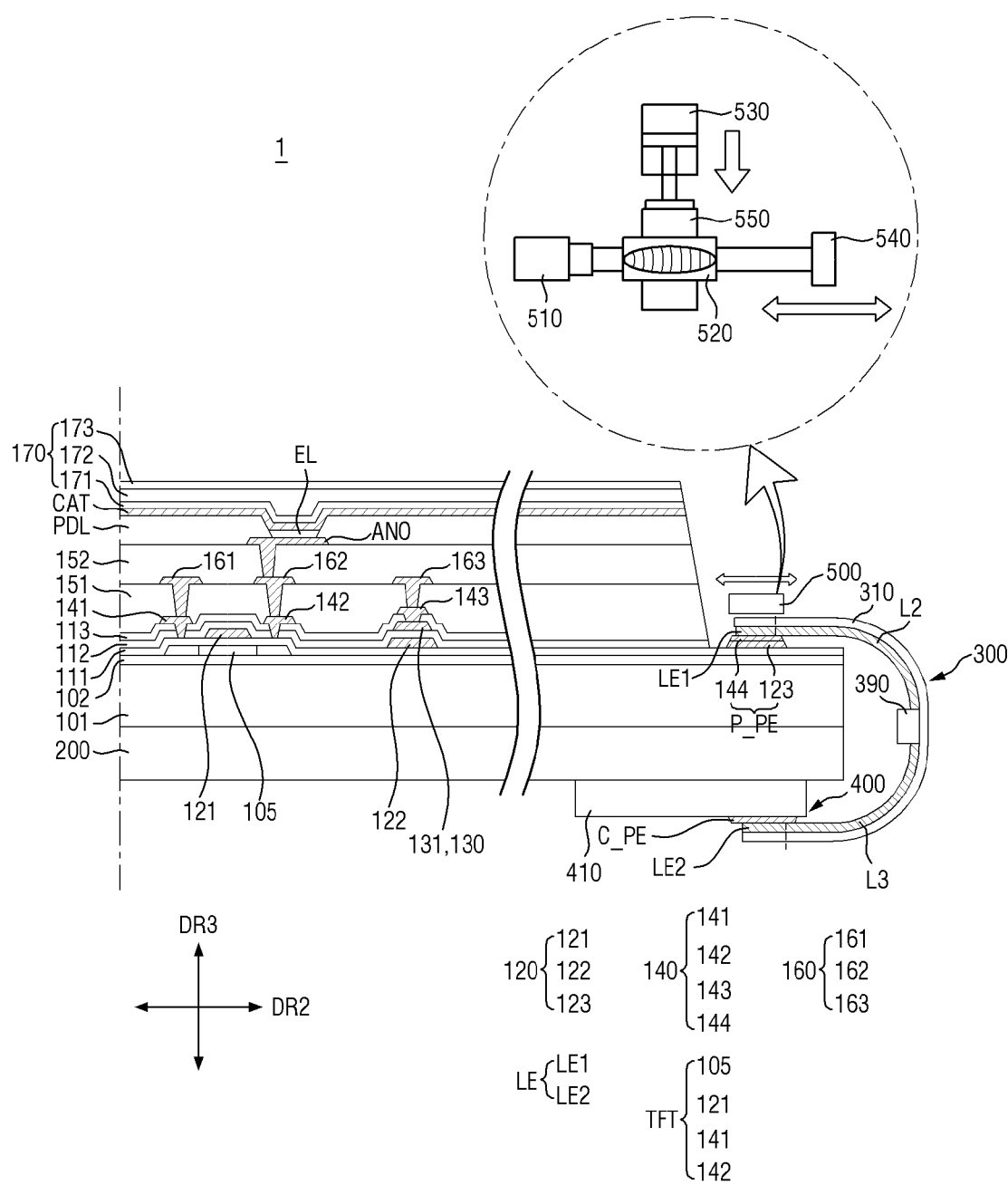
FIG. 2 is a cross-sectional view of the display apparatus of FIG. 1.

FIG. 1 is a plan layout view of a display apparatus according to an embodiment, and FIG. 2 is a cross-sectional view of the display apparatus of FIG. 1.

A display apparatus 1 is an apparatus for displaying a moving picture and/or a still image, and the display apparatus 1 may be used as a display screen of various suitable products, for example, such as a television, a laptop, a monitor, a billboard, an Internet of Things device, and the like, as well as a portable electronic device, for example, such as a mobile phone, a smart phone, a tablet PC (personal computer), a smart watch, a watch phone, a mobile communication terminal, an electronic notebook, an e-book reader, a portable multimedia player (PMP), a navigation device, an ultra-mobile PC (UMPC), and the like.

Referring to FIG. 1, the display apparatus 1 may include a display panel 100 for displaying an image, a panel lower sheet 200 disposed below the display panel 100, a first circuit board 300 connected to the display panel 100, and a second circuit board 400 connected to the first circuit board 300 and attached to a lower surface of the panel lower sheet 200.

An example of the display panel 100 may include, for example, an organic light-emitting display panel. Hereinafter, for convenience of illustration and description, the organic light-emitting display panel is described in more detail as being applied as the display panel 100, but the present disclosure is not limited thereto, and other suitable kinds of display panels may be applied as the display panel 100, for example, such as a liquid crystal display (LCD), a quantum dot organic light-emitting display panel (QD-OLED), a quantum dot liquid crystal display (QD-LCD), a quantum nano light-emitting display panel (QNED), and a micro LED.

The display panel 100 includes a display area DA for displaying an image, and a non-display area NA disposed around (e.g., a periphery of) the display area DA. The display area DA may have a rectangular shape with right-angled corners or a rectangular shape with rounded corners on a plane (e.g., in a plan view or a view from a direction that is perpendicular to or substantially perpendicular to a surface of the relevant element or layer, for example, such as the top surface of the display panel 100). The display area DA may have a short side and a long side. The short side of the display area DA may be a side extending in a first direction DR1. The long side of the display area DA may be a side extending in a second direction DR2 that crosses the first direction DR1. However, a planar shape (e.g., a shape in a plan view) of the display area DA is not limited to the rectangular shape, and the display area DA may have any suitable planar shape, for example, such as a circular shape, an elliptical shape, or other various suitable shapes. The non-display area NA may be disposed to be adjacent to both short sides and both long sides of the display area DA. In this case, the non-display area NA may surround (e.g., around a periphery of) all sides of the display area DA to form an edge of the display area DA. However, the present disclosure is not limited thereto, and the non-display area NA may be disposed to be adjacent to only both short sides or both long sides of the display area DA.

The non-display area NA may further include a panel pad area P_PA at (e.g., in or on) one side of the display panel 100 in the second direction DR2. The display panel 100 may include at least one panel pad terminal (e.g., see 'P_PE' in FIG. 2), and a dummy pad terminal (e.g., see 'D_PE' in FIG. 3). The panel pad terminal P_PE and the dummy pad terminal D_PE may be disposed at (e.g., in or on) the panel pad area P_PA.

The first circuit board 300 may be disposed on an upper surface of the panel pad area P_PA of the display panel 100. The first circuit board 300 may be connected to the upper surface of the panel pad area P_PA.

The first circuit board 300 may include a first circuit area CA1 attached to the panel pad area P_PA, a second circuit area CA2 to be attached to the second circuit board 400, which will be described in more detail below, and a third circuit area CA3 disposed between the first circuit area CA1 and the second circuit area CA2. The first circuit area CA1 may overlap with the panel pad area P_PA in a thickness direction (e.g., a third direction DR3 that is perpendicular to or substantially perpendicular to the first and second directions DR1 and DR2). The second circuit area CA2 may overlap with a circuit pad area C_PA of the second circuit board 400, which will be described in more detail below, in the thickness direction.

Figure 3:
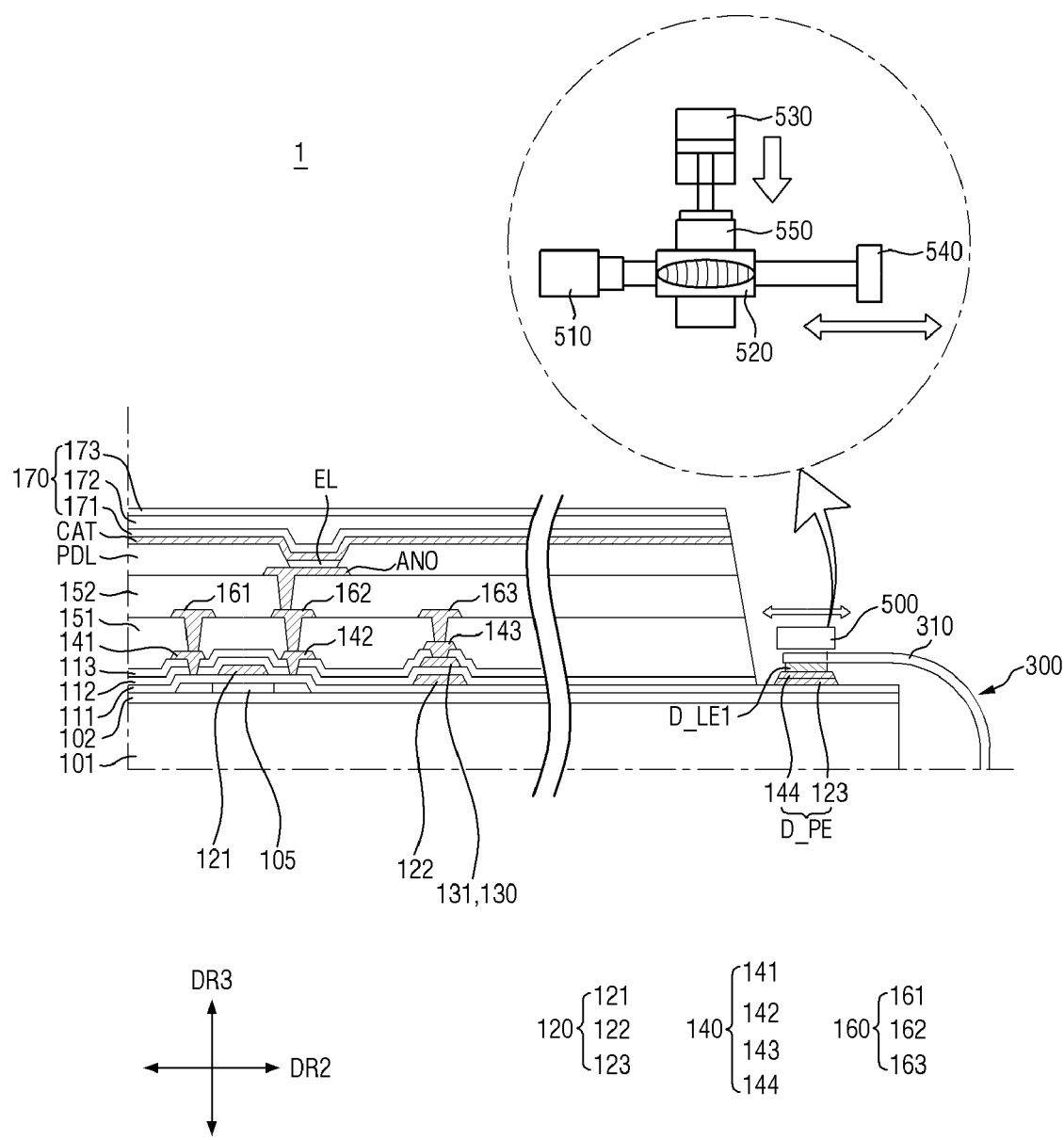
FIG. 3 is another cross-sectional view of the display apparatus of FIG. 1.

The first circuit board 300 may include lead terminals (e.g., see 'LE1' and 'LE2' in FIG. 2), and a dummy lead terminal (e.g., see 'D_LE' in FIG. 3). As described in more detail below, a lead terminal LE may include a first lead terminal LE1 disposed at (e.g., in or on) the first circuit area CA1, and a second lead terminal LE2 disposed at (e.g., in or on) the second circuit area CA2.

The first circuit board 300 may include a data driving integrated circuit 390 disposed on a first surface (e.g., on one surface) of the first circuit board 300. The data driving integrated circuit 390 may be implemented as a data driving chip, and may be attached to the display panel 100 through the first circuit board 300 by applying a chip on film (COF) method. However, the present disclosure is not limited thereto, and the data driving integrated circuit 390 may be attached to a plastic substrate by a chip on plastic (COP) method, or to a glass substrate by a chip on glass (COG) method.

The second circuit board 400 may be disposed on the second circuit area CA2 of the first circuit board 300. FIG. 1 shows that the second circuit board 400 is disposed on the first surface of the first circuit board 300, but the present disclosure is not limited thereto, and the second circuit board 400 may be disposed on a second surface (e.g., another surface) of the first circuit board 300 that is opposite to the first surface.

The second circuit board 400 may include the circuit pad area C_PA that is attached to the second circuit area CA2 of the first circuit board 300. The second circuit board 400 may include circuit pad terminals disposed at (e.g., in or on) the circuit pad area C_PA.

Hereinafter, various configurations of the display panel 100, the panel lower sheet 200, the first circuit board 300, and the second circuit board 400 will be described in more detail.

FIG. 2 is a cross-sectional view taken along the second direction DR2 of the display apparatus 1 of FIG. 1, and FIG. 3 is another cross-sectional view of the display apparatus 1 of FIG. 1.

FIGS. 2 and 3 show cross-sectional shapes of one pixel area and the panel pad area P_PA of FIG. 1. Further, FIGS. 2 and 3 illustrate the first circuit board 300 and the second circuit board 400 disposed on the panel pad area P_PA. FIG. 2 shows a state in which the panel pad terminal P_PE and the first lead terminal LE1, which will be described in more detail below, are coupled (e.g., are connected) to each other at (e.g., in or on) the panel pad area P_PA. FIG. 3 shows a state in which the dummy pad terminal D_PE and the dummy lead terminal D_LE (e.g., a first dummy lead terminal D_LE1), which will be described in more detail below, are connected to each other at (e.g., in or on) the panel pad area P_PA. The below description with reference to FIG. 2 may be applied to FIG. 3 in the same or substantially the same manner, except that FIG. 3 shows the dummy pad terminal D_PE and the dummy lead terminal D_LE that are coupled to each other at (e.g., in or on) the panel pad area P_PA.

Referring to FIGS. 2 and 3, the display panel 100 may include a base substrate 101, a plurality of conductive layers, a plurality of insulating layers for insulating the conductive layers, organic layers EL, and the like.

The base substrate 101 is disposed over the display area DA and the non-display area NA. The base substrate 101 may function to support various suitable elements that are disposed thereon. In an embodiment, the base substrate 101 may be a rigid substrate including a rigid material, for example, such as soft glass, quartz, and/or the like. However, the present disclosure is not limited thereto, and the base substrate 101 may be a semi-flexible substrate or a flexible substrate including one or more (e.g., some) flexible materials. In this case, the base substrate 101 may include polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), cycloolefin polymer (COP), or the like.

A buffer layer 102 may be disposed on the base substrate 101. The buffer layer 102 may prevent or substantially prevent the penetration of moisture and oxygen from the outside via the base substrate 101. In addition, the buffer layer 102 may planarize or substantially planarize a surface of the base substrate 101. As an example embodiment, the buffer layer 102 may include any one of a silicon nitride ($SiN_x$) film, a silicon oxide ($SiO_2$) film, and/or a silicon oxynitride ($SiO_xN_y$) film.

A semiconductor layer 105 may be disposed on the buffer layer 102. The semiconductor layer 105 forms a channel of a thin film transistor TFT. The semiconductor layer 105 may be disposed at (e.g., in or on) each pixel of the display area DA, and in some cases, may also be disposed at (e.g., in or on) the non-display area NA. The semiconductor layer 105 may include a source/drain region, and an active region. The semiconductor layer 105 may include, for example, polycrystalline silicon.

A first insulating layer 111 may be disposed on the semiconductor layer 105. The first insulating layer 111 may be disposed over the entire surface of the base substrate 101. The first insulating layer 111 may be a gate insulating film having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These materials may be used alone or in combination with each other.

A first conductive layer 120 may be disposed on the first insulating layer 111. In an embodiment, the first conductive layer 120 may include a gate electrode 121 of the thin film transistor TFT, a first electrode 122 of a storage capacitor Cst, and a first pad electrode 123. The first conductive layer 120 may include a metal material. The first conductive layer 120 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a stacked film including one or more of the above-described materials.

A second insulating layer 112 may be disposed on the first conductive layer 120. The second insulating layer 112 may insulate the first conductive layer 120 and a second conductive layer 130. The second insulating layer 112 may include one or more materials selected from among the above-described materials of the first insulating layer 111.

The second conductive layer 130 may be disposed on the second insulating layer 112. The second conductive layer 130 may include a second electrode 131 of the storage capacitor Cst. A material of the second conductive layer 130 may be selected from one or more of the above-described materials of the first conductive layer 120. The first electrode 122 and the second electrode 131 of the storage capacitor Cst may form a capacitor through the second insulating layer 112.

A third insulating layer 113 may be disposed on the second conductive layer 130. The third insulating layer 113 may include one or more of the above-described materials of the first insulating layer 111.

A third conductive layer 140 may be disposed on the third insulating layer 113. The third conductive layer 140 may include a source electrode 141, a drain electrode 142, a power supply voltage electrode 143, and a second pad electrode 144. The third conductive layer 140 may include one or more of the above-described materials of the first conductive layer 120. For example, the third conductive layer 140 may be a single film made of at least one of the above-described materials of the first conductive layer 120. However, the present disclosure is not limited thereto, and the third conductive layer 140 may be a stacked film. For example, the third conductive layer 140 may be formed in a stacked structure of Ti/Al/Ti, Mo/Al/Mo, Mo/AlGe/Mo, Ti/Cu, or the like.

The second pad electrode 144 may be disposed on an upper surface of the first pad electrode 123 corresponding in the thickness direction (e.g., in the third direction DR3). The first pad electrode 123 and the second pad electrode 144 overlapping with each other in the thickness direction may constitute the panel pad terminal P_PE and/or the dummy pad terminal D_PE. A width of the second pad electrode 144 in the second direction DR2 may be smaller than a width of the first pad electrode 123 in the second direction DR2. At least one side surface (e.g., at least one end) of the first pad electrode 123 may protrude outward further than at least one side surface (e.g., at least one end) of the second pad electrode 144. The panel pad terminal P_PE and the dummy pad terminal D_PE will be described in more detail below.

As described above, the third insulating layer 113 is disposed on the second conductive layer 130, and the structures (e.g., the layers) disposed on the second conductive layer 130 including the third insulating layer 113 may be omitted or removed at (e.g., in or on) the panel pad area P_PA. Accordingly, the omitted or removed structures may expose the panel pad terminal P_PE and the dummy pad terminal D_PE disposed at (e.g., in or on) the panel pad area P_PA.

As described in more detail below, the first lead terminal LE1 may be coupled to the exposed panel pad terminal P_PE, and the dummy lead terminal D_LE (e.g., the first dummy lead terminal D_LE1) may be coupled to the exposed dummy pad terminal D_PE. In an embodiment, the first lead terminal LE1 may be directly coupled (e.g., directly connected) to the panel pad terminal P_PE by ultrasonic bonding, without any intervening configuration or layer between the first lead terminal LE1 and the panel pad terminal P_PE. The dummy lead terminal D_LE (e.g., the first dummy lead terminal D_LE1) may also be directly coupled to the dummy pad terminal D_PE by the ultrasonic bonding, without any intervening configuration or layer between the dummy pad terminal D_PE and the dummy lead terminal D_LE.

A first via layer 151 may be disposed on the third conductive layer 140. The first via layer 151 may include an organic insulating material, for example, such as acrylic resin (e.g., polyacrylic resin), epoxy resin, phenolic resin, polyamide resin, polyimide resin, unsaturated polyester resin, polyphenylene ether resin, polyphenylene sulfide resin, or benzocyclobutene (BCB).

A fourth conductive layer 160 may be disposed on the first via layer 151. The fourth conductive layer 160 may include power supply voltage lines 161 and 163, and a connection electrode 162. The power supply voltage line (e.g., a first power supply voltage line) 161 may be electrically connected to the source electrode 141 of the thin film transistor TFT via a contact hole passing through (e.g., penetrating) the first via layer 151. The connection electrode 162 may be electrically connected to the drain electrode 142 of the thin film transistor TFT via a contact hole passing through (e.g., penetrating) the first via layer 151. The power supply voltage line (e.g., a second power supply voltage line) 163 may be electrically connected to the power supply voltage electrode 143 via a contact hole passing through (e.g., penetrating) the first via layer 151.

The fourth conductive layer 160 may include at least one metal selected from among aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and molybdenum (Mo). The fourth conductive layer 160 may be a single film, but the present disclosure is not limited thereto, and the fourth conductive layer 160 may be formed as a multilayered film. For example, the fourth conductive layer 160 may be formed in a stacked structure of Ti/Al/Ti, Mo/Al/Mo, Mo/AlGe/Mo, Ti/Cu, or the like.

A second via layer 152 is disposed on the fourth conductive layer 160. The second via layer 152 may include one or more of the above described materials of the first via layer 151. The second via layer 152 may include an organic insulating material, for example, such as acrylic resin (e.g., polyacrylic resin), epoxy resin, phenolic resin, polyamide resin, polyimide resin, unsaturated polyester resin, polyphenylene ether resin, polyphenylene sulfide resin, or benzocyclobutene (BCB).

An anode ANO is disposed on the second via layer 152. The anode ANO may be electrically connected to the connection electrode 162 via a contact hole passing through (e.g., penetrating) the second via layer 152.

A pixel defining layer PDL may be disposed on the anode ANO. The pixel defining layer PDL may include an opening exposing the anode ANO. The pixel defining layer PDL may be made of an organic insulating material or an inorganic insulating material. In an embodiment, the pixel defining layer PDL may include a material such as a photoresist, polyimide resin, acrylic resin (e.g., polyacrylic resin), a silicone compound, polyacrylic resin, or the like.

The organic layer EL may be disposed on an upper surface of the anode ANO, and in the opening of the pixel defining layer PDL. A cathode CAT is disposed on the organic layer EL and the pixel defining layer PDL. The cathode CAT may be a common electrode disposed over a plurality of pixels.

A thin film encapsulation layer 170 is disposed on the cathode CAT. The thin film encapsulation layer 170 may cover an organic light-emitting diode OLED. The thin film encapsulation layer 170 may be a stacked film in which an inorganic film and an organic film are alternately stacked on one another. For example, the thin film encapsulation layer 170 may include a first inorganic film 171, an organic film 172, and a second inorganic film 173 that are sequentially stacked on one another.

The panel pad terminal P_PE and the dummy pad terminal D_PE may be disposed at (e.g., in or on) the panel pad area P_PA as described above. The panel pad terminal P_PE may have a structure in which the second pad electrode 144 is stacked on the first pad electrode 123.

In addition, the panel pad terminal P_PE may be formed of one first pad electrode 123 and one second pad electrode 144. A planar shape of the panel pad electrode P_PE may be determined according to a profile protruding outward from a planar view point.

In an embodiment, the first pad electrode 123 and the second pad electrode 144 may have a shape in which all side surfaces (e.g., all ends) thereof are tapered, and the side surfaces of the second pad electrode 144 and the first pad electrode 123 may be aligned with each other. In this case, a lower surface of the first pad electrode 123 may protrude outward from a lower surface of the second pad electrode 144, so that the planar shape of the panel pad terminal P_PE may be determined by an outer profile of the first pad electrode 123.

However, the present disclosure is not limited thereto, and the side surfaces of the first pad electrode 123 and the second pad electrode 144 may not have the tapered shape, and the side surfaces of the second pad electrode 144 may be positioned inside the side surfaces of the first pad electrode 123, or the side surfaces of the second pad electrode 144 may be positioned to protrude outward from the side surfaces of the first pad electrode 123. In this case, because the planar shape of the panel pad electrode P_PE is determined according to the profile protruding outward in the plan view, the planar shape thereof may also be variously modified.

However, the present disclosure is not limited thereto, and the stacked structure and/or the shape of the panel pad terminal P_PE may be variously modified. For example, the first pad electrode 123 may include a plurality of patterns, and the second pad electrode 144 that is disposed on the first pad electrode 123 may have surface irregularities by reflecting a step difference of the patterns.

As another example, the second insulating layer 112 may be extended to be disposed between the first pad electrode 123 and the second pad electrode 144. In this case, the second insulating layer 112 may include a plurality of contact holes. In other words, the second insulating layer 112 may be regarded as including a plurality of insulating patterns. In this case, the second pad electrode 144 that is disposed on the second insulating layer 112 may have surface irregularities by reflecting a surface level difference caused by the insulating patterns of the second insulating layer.

As another example, a third pad electrode may be further included between the first pad electrode 123 and the second pad electrode 144. The third pad electrode may be included as a part of the second conductive layer 130.

In some embodiments, the first pad electrode 123 may be included as a part of the second conductive layer 130 instead of as a part of the first conductive layer 120, and the second pad electrode 144 may be included as a part of the fourth conductive layer 160 instead of as a part of the third conductive layer 140.

As shown in FIG. 3, the dummy pad terminal D_PE may have the same or substantially the same stacked structure as that of the panel pad terminal P_PE, but the present disclosure is not limited thereto. For example, the dummy pad electrode D_PE may be formed to include only the first pad electrode 123, or may be formed to include only the second pad electrode 144.

As described above, the first circuit board 300 may be disposed at (e.g., in or on) the panel pad area P_PA of the display panel 100. One end of the first circuit board 300 is attached to the panel pad area P_PA and is bent to surround (e.g., to extend around) one side surface (e.g., one end) of the base substrate 101, so that another end (e.g., an opposite end) of the first circuit board 300 may be disposed to overlap with the lower surface of the panel lower sheet 200. The first circuit board 300 may include a base film 310, and various elements may be disposed on a surface (e.g., on one surface) of the base film 310.

The other end (e.g., the opposite end) of the first circuit board 300 may be connected to the second circuit board 400. The second circuit board 400 may be attached to the lower surface of the panel lower sheet 200.

Figure 4:
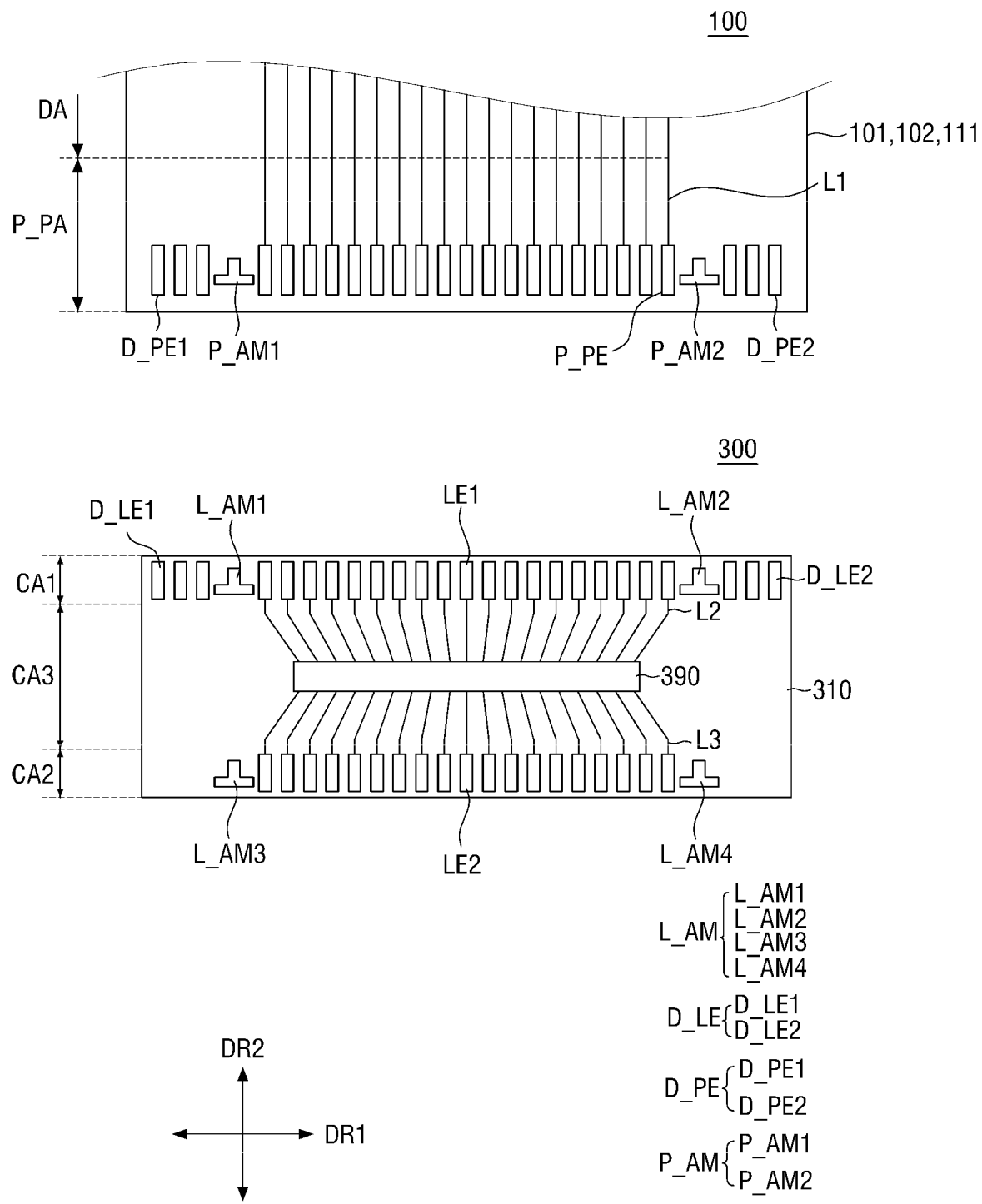
FIG. 4 is a plan layout view of a panel pad area and a first circuit board of the display apparatus of FIG. 1.
Figure 5:
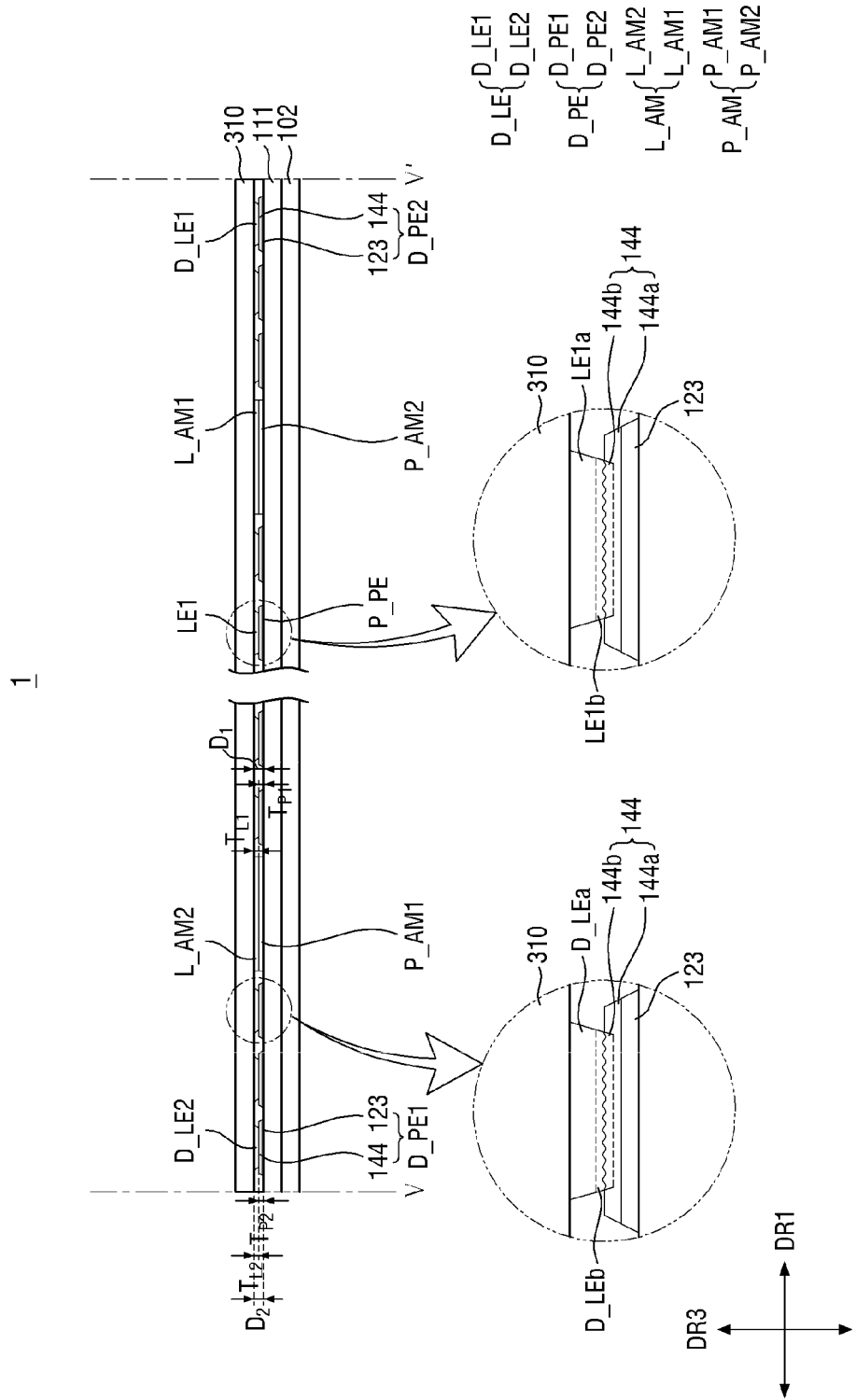
FIG. 5 is a cross-sectional view taken along the line V-V' of FIG. 1.

FIGS. 4 and 5 are referenced to describe the panel pad area P_PA and the circuit areas CA1, CA2, and CA3 in more detail.

FIG. 4 is a plan layout view of the panel pad area P_PA and the first circuit board 300 of FIG. 1, and FIG. 5 is a cross-sectional view taken along the line V-V' of FIG. 1.

Referring to FIGS. 4 and 5, the panel pad terminal P_PE and the dummy pad terminal D_PE may be disposed at (e.g., in or on) the panel pad area P_PA. The display panel 100 may further include a panel alignment mark P_AM. The panel alignment mark P_AM is disposed at (e.g., in or on) the panel pad area P_PA. The display panel 100 may further include a first signal line L1 for connecting the panel pad terminal P_PE to the display area DA.

In addition, the first lead terminal LE1 may be disposed at (e.g., in or on) the first circuit area CA1, and the second lead terminal LE2 may be disposed at (e.g., in or on) the second circuit area CA2. The first circuit board 300 may further include a lead alignment mark L_AM. The lead alignment mark L_AM is disposed at (e.g., in or on) the first circuit area CA1 and the second circuit area CA2. The first circuit board 300 may further include the data driving integrated circuit 390 at (e.g., in or on) the third circuit area CA3. The first circuit board 300 may further include a second signal line L2 for connecting the first lead terminal LE1 and the data driving integrated circuit 390 to each other, and a third signal line L3 for connecting the second lead terminal LE2 and the data driving integrated circuit 390 to each other.

The panel pad terminal P_PE may be disposed at (e.g., in or on) a central portion of the panel pad area P_PA. The panel pad terminal P_PE may be electrically connected to at least one transistor disposed at (e.g., in or on) the display area DA via the first signal line L1.

The panel pad terminal P_PE may include a long side and a short side. The long side may be a side extending in the second direction DR2, and the short side may be a side extending in the first direction DR1, but the present disclosure is not limited thereto. The planar shape of the panel pad terminal P_PE may be a rectangular shape, but the present disclosure is not limited thereto, and the planar shape of the panel pad terminal P_PE may be a square shape.

The panel alignment mark P_AM may include a first panel alignment mark P_AM1, and a second panel alignment mark P_AM2 that are disposed to be spaced apart from each other with the panel pad terminal P_PE therebetween.

The first and second panel alignment marks P_AM1 and P_AM2 may be disposed at (e.g., in or on) opposite sides of the panel pad terminal P_PE, respectively, and may mark the panel pad terminal P_PE. In addition, the panel alignment mark P_AM may be disposed to overlap with the lead alignment mark L_AM in the thickness direction. The panel alignment mark P_AM together with the lead alignment mark L_AM may align the panel pad terminal P_PE and the first lead terminal LE1 with each other, such that the panel pad terminal P_PE and the first lead terminal LE1 correspond to each other in the thickness direction.

The panel alignment mark P_AM may have a stacked structure that is the same or substantially the same as (or similar to) that of the panel pad terminal P_PE. However, the present disclosure is not limited thereto, and the panel alignment mark P_AM may be formed to include only the first pad electrode 123, or may be formed to include only the second pad electrode 144. In addition, the panel alignment mark P_AM may be made of a conductive material that is different from that of each of the first pad electrode 123 and the second pad electrode 144.

FIG. 4 illustrates that the panel alignment mark P_AM has a shape including a reference plane extending in the first direction DR1 and a protruding surface (e.g., a protruding end) protruding from the reference plane in the second direction DR2, but the present disclosure is not limited thereto, and the panel alignment mark P_AM may have various suitable shapes.

Unlike the panel pad terminal P_PE, the panel alignment mark P_AM is not electrically connected to at least one transistor that is disposed at (e.g., in or on) the display area DA. In other words, the panel alignment mark P_AM may be floated (e.g., may be electrically floated).

In FIG. 4, one first panel alignment mark P_AM1 and one second panel alignment mark P_AM2 are shown, but the present disclosure is not limited thereto, and the number of each of the first and second panel alignment marks P_AM1 and P_AM2 may be two or more.

The dummy pad terminal D_PE may be disposed to be adjacent to a long side of the base substrate 101 (e.g., an edge of the base substrate 101). The dummy pad terminal D_PE may be disposed to be spaced apart from the panel pad terminal P_PE with the panel alignment mark P_AM therebetween.

The dummy pad terminal D_PE may have the same or substantially the same planar shape as that of the panel pad terminal P_PE described above, but the present disclosure is not limited thereto.

In FIG. 4, three first dummy pad terminals D_PE1 and three second dummy pad terminals D_PE2 are shown, but the present disclosure is not limited thereto, and the number of each of the first and second dummy pad terminals D_PE1 and D_PE2 may be two, four, or more.

Unlike the panel pad terminal P_PE, the dummy pad terminal D_PE is not electrically connected to at least one transistor disposed at (e.g., in or on) the display area DA. In other words, the dummy pad terminal D_PE may be floated (e.g., may be electrically floated).

The first lead terminal LE1 may be disposed at (e.g., in or on) a central portion of the first circuit area CA1. The first lead terminal LE1 may be electrically connected to the data driving integrated circuit 390 via the second signal line L2.

The first lead terminal LE1 may include a metal material. The first lead terminal LE1 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first lead terminal LE1 may be a single film or a stacked film made of one or more of the above-described materials. In an embodiment, the material(s) included in the first lead terminal LE1 may be different from the material(s) included in the panel pad terminal P_PE that is coupled to the first lead terminal LE1. For example, the first lead terminal LE1 may include silver (Ag), gold (Au), or copper (Cu), and the panel pad terminal P_PE may include Ti/Al/Ti, Mo/Al/Mo, Mo/AlGe/Mo, or Ti/Cu.

The second lead terminal LE2 may be disposed at (e.g., in or on) a central portion of the second circuit area CA2. The second lead terminal LE2 may be electrically connected to the data driving integrated circuit 390 via the third signal line L3.

The second lead terminal LE2 may include one or more of the above described materials as that of the first lead terminal LE1.

The first and second lead terminals LE1 and LE2 may have the same or substantially the same planar shape as that of the panel pad terminal P_PE described above. However, the planar sizes of the lead terminals LE1 and LE2 may be smaller than the planar size of the panel pad terminal P_PE.

The lead alignment mark L_AM may include first to fourth lead alignment marks L_AM1 to L_AM4. The first and second lead alignment marks L_AM1 and L_AM2 may be disposed to be spaced apart from each other with the first lead terminal LE1 therebetween. The third and fourth lead alignment marks L_AM3 and L_AM4 may be disposed to be spaced apart from each other with the second lead terminal LE2 therebetween.

The first and second lead alignment marks L_AM1 and L_AM2 may be disposed at (e.g., in or on) opposite sides of the first lead terminal LE1, respectively, and may mark the first lead terminal LE1. In addition, the first and second lead alignment marks L_AM1 and L_AM2 may be disposed to overlap with the panel alignment mark P_AM in the thickness direction as described above, and may align the first lead terminal LE1 to correspond to the panel pad terminal P_PE in the thickness direction.

The third and fourth lead alignment marks L_AM3 and L_AM4 may be disposed at (e.g., in or on) opposite sides of the second lead terminal LE2, respectively, and may mark the second lead terminal LE2.

The lead alignment mark L_AM may have a stacked structure that is the same or substantially the same as (or similar to) that of the first lead terminal LE1, and may be made of the same or substantially the same material as that of the first lead terminal LE1.

In FIG. 4, the lead alignment mark L_AM may have the same or substantially the same shape as that of the panel alignment mark P_AM described above.

However, the present disclosure is not limited thereto, and the lead alignment mark L_AM may have a shape that is different from that of the panel alignment mark P_AM. In this case, the lead alignment mark L_AM may still have a suitable shape to be aligned with the panel alignment mark P_AM. For example, the lead alignment mark L_AM may have a shape, for example, such that the lead alignment mark L_AM is aligned with at least one side of the panel alignment mark P_AM in the thickness direction.

In FIG. 4, the number of each of the first to fourth lead alignment marks L_AM1 to L_AM4 is shown as one, but the present disclosure is not limited thereto, and the number of each of the first to fourth lead alignment marks L_AM1 to L_AM4 may be two or more.

Unlike the first and second lead terminals LE1 and LE2, the lead alignment mark L_AM is not electrically connected to the data driving integrated circuit 390. In other words, the lead alignment mark L_AM may be floated (e.g., may be electrically floated).

The dummy lead terminal D_LE may be disposed at (e.g., in or on) the first circuit area CA1 to be adjacent to a long side of the base substrate 101 (e.g., an edge of the base substrate 101) when the first circuit board 300 is connected to the display panel 100. The dummy lead terminal D_LE may include a first dummy lead terminal D_LE1 that is disposed between the first lead alignment mark L_AM1 and one edge of the first circuit board 300 (e.g., to be adjacent to one long side of the base substrate 101 when the first circuit board 300 is connected to the display panel 100), and a second dummy lead terminal D_LE2 that is disposed between the second lead alignment mark L_AM2 and an opposite edge of the first circuit board 300 (e.g., to be adjacent to another long side of the base substrate 101 when the first circuit board 300 is connected to the display panel 100). The first and second dummy lead terminals D_LE1 and D_LE2 may be disposed to be spaced apart from the first lead terminal LE1 with the first and second lead alignment marks L_AM1 and L_AM2 therebetween, respectively.

The dummy lead terminal D_LE may have the same or substantially the same planar shape as that of the first lead terminal LE1 described above, but the present disclosure is not limited thereto.

In FIG. 4, three first dummy lead terminals D_LE1 and three second dummy lead terminals D_LE2 are shown, but the present disclosure is not limited thereto, and the number of each of the first and second dummy lead terminals D_LE1 and D_LE2 may be two, four, or more.

Unlike the first lead terminal LE1, the dummy lead terminal D_LE is not electrically connected to the data driving integrated circuit 390. In other words, the dummy lead terminal D_LE may be floated (e.g., may be electrically floated).

Referring to FIG. 5, as described above, the first lead terminals LE1 may be directly coupled to the panel pad terminals P_PE at (e.g., in or on) a central portion of the first circuit board 300, without any intervening configuration or layer between the first lead terminals LE1 and the panel pad terminals P_PE.

The dummy lead terminals D_LE1 and D_LE2 may be directly coupled to the dummy pad terminals D_PE1 and D_PE2 at an edge portion of the first circuit board 300, without any intervening configuration or layer between the dummy lead terminals D_LE1 and D_LE2 and the dummy pad terminals D_PE1 and D_PE2.

Further, the first and second lead alignment marks L_AM1 and L_AM2 may be directly coupled to the panel alignment marks P_AM1 and P_AM2 at (e.g., in or on) a region between the dummy lead terminals D_LE1 and D_LE2 and the first lead terminal LE1, without any intervening configuration or layer between the first and second lead alignment marks L_AM1 and L_AM2 and the panel alignment marks P_AM1 and P_AM2.

The panel pad terminal P_PE may be directly coupled to the first lead terminal LE1 by ultrasonic bonding, and the dummy lead terminals D_LE1 and D_LE2 may be directly coupled to the dummy pad terminals D_PE1 and D_PE2 by ultrasonic bonding.

Referring back to FIG. 2, the ultrasonic bonding may be performed by an ultrasonic apparatus 500.

As shown in FIG. 2, the ultrasonic apparatus 500 may include a vibration generating unit (e.g., a vibration generating part or a vibration generator) 510, a vibration unit (e.g., a vibrating part or a vibrating device) 520 connected to the vibration generating unit 510, a pressing unit (e.g., a pressing part or a pressing device) 530 that amplifies a vibration amplitude of the vibration unit 520, and a vibration transmitting unit (e.g., a vibration transmitting part or a vibration transmitter) 540 connected to the vibration unit 520.

The vibration generating unit 510 may convert electrical energy into vibration energy. The vibration unit 520 may vibrate according to the vibration energy converted by the vibration generating unit 510. The vibration unit 520 may vibrate while having a constant or substantially constant vibration direction, and a suitable amplitude (e.g., a predetermined amplitude). The amplitude of the vibration unit 520 may be amplified in a direction parallel to or substantially parallel to the vibration direction by the pressing unit 530 connected to the vibration unit 520. The vibration transmitting unit 540 may transmit a vibration of the vibration unit 520 to an ultrasonic bonding object. A support unit (e.g., a support part or a support structure) 550 may fix upper and lower surfaces of the vibration unit 520 to suppress the vibration from moving the vibration unit 520 and the vibration transmitting unit 540 in an upward and downward direction.

In an embodiment, the ultrasonic apparatus 500 is in contact with the other surface (e.g., the second surface) of the first circuit board 300, and maintains or substantially maintains a constant pressurized state in a downward direction so that the vibration transmitting unit 540 efficiently transmits the vibration to the first circuit board 300. In this case, as shown in FIG. 5, the vibration transmitting unit 540 of the ultrasonic apparatus 500 may perform the ultrasonic bonding while overlapping with the entire area of the first circuit board 300 that is disposed thereunder.

The ultrasonic apparatus 500 may vibrate the first lead terminal LE1 in the vibration direction, while vibrating in the vibration direction (e.g., a predetermined vibration direction). However, in this case, the panel pad terminal P_PE may vibrate slightly in the vibration direction due to the vibration being transmitted through the first lead terminal LE1, but a vibration amplitude thereof may be insignificant. Therefore, the vibration amplitude of the vibration transmitting unit 540 in the vibration direction may be regarded as the same or substantially the same as a distance in which the first lead terminal LE1 moves on the panel pad terminal P_PE in the vibration direction. In an embodiment, the vibration direction may be the second direction DR2. In other words, the vibration direction may be a direction in which the long sides of the panel pad terminal P_PE and the first lead terminal LE1 extend.

When the first lead terminal LE1 is ultrasonically vibrated on one surface of the panel pad terminal P_PE, a suitable frictional force (e.g., a predetermined frictional force) is generated at an interface between the one surface of the panel pad terminal P_PE and one surface of the first lead terminal LE1, and thus, frictional heat may be generated by the frictional force. When the frictional heat is sufficient to melt a material used for forming the panel pad terminal P_PE and a material used for forming the first lead terminal LE1, a panel melting region 144b, which is adjacent to the first lead terminal LE1, of the panel pad terminal P_PE, and a lead melting region LE1*b*, which is adjacent to the panel pad terminal P_PE, of the first lead terminal LE1, may be melted. In other words, the panel pad terminal P_PE may include a panel non-melting region 144*a* and the panel melting region 144*b*. In addition, the first lead terminal LE1 may include a lead non-melting region LE1*a* and the lead melting region LE1*b*.

The panel non-melting region 144*a* may be a region including only a material included in the panel pad terminal P_PE. The lead non-melting region LE1*a* may be a region including only a material included in the first lead terminal LE1.

The panel melting region 144*b* may be a region in which the material included in the first lead terminal LE1 is diffused to mix the material of the panel pad terminal P_PE and the material of the first lead terminal LE1 with each other, and the lead melting region LE1*b* may be a region in which the material included in the panel pad terminal P_PE is diffused to mix the material of the first lead terminal LE1 and the material of the panel pad terminal P_PE with each other. For example, when the first lead terminal LE1 includes silver (Ag), gold (Au), or copper (Cu), and the panel pad terminal P_PE includes Ti/Al/Ti, the panel melting region 144*b* may be a region in which Ti and/or Al of the panel pad terminal P_PE and silver (Ag), gold (Au), or copper (Cu) of the first lead terminal LE1 are mixed with each other. In addition, the lead melting region LE1*b* may be a region in which silver (Ag), gold (Au), or copper (Cu) of the first lead terminal LE1 and Ti and/or Al of the panel pad terminal P_PE are mixed with each other.

In the panel melting region 144*b* and the lead melting region LE1*b*, the panel pad terminal P_PE and the first lead terminal LE1 may be coupled to each other while undergoing solidification.

An interface between the panel pad terminal P_PE and the first lead terminal LE1, or in other words, an interface between the panel melting region 144*b* and the lead melting region LE1*b* may have a non-flat shape.

When the ultrasonic bonding is not particularly related to the panel pad terminal P_PE and the first lead terminal LE1, the ultrasonic bonding may be applied to the dummy pad terminal D_PE and the dummy lead terminal D_LE (e.g., including a dummy lead non-melting region D_LE*a* and a dummy lead melting region D_LE*b* as shown in FIG. 5), as well as the panel alignment mark P_AM and the lead alignment mark L_AM.

Referring back to FIG. 5, the panel pad terminal P_PE may have a first pad thickness TP1, and the first lead terminal LE1 may have a first lead thickness TL1. In addition, the dummy pad terminal D_PE may have a second pad thickness TP2, and the dummy lead terminal D_LE may have a second lead thickness TL2.

Accordingly, a separation distance from the first insulating layer 111 to the first circuit board 300 may be maintained to be the same or substantially the same in the central portion and in the edge portion of the first circuit board 300. In other words, the separation distance between one surface of the first circuit board 300 and one surface of the first insulating layer 111 at the central portion of the first circuit board 300 may be a first separation distance D1, and the separation distance between the one surface of the first circuit board 300 and the one surface of the first insulating layer 111 at the edge portion of the first circuit board 300 may be a second separation distance D2.

As described above, the ultrasonic bonding between the first circuit board 300 and the panel pad area P_PA of the display panel 100 may be performed between the entire first circuit board 300 and the panel pad area P_PA overlapping with the first circuit board 300. When the ultrasonic bonding is performed, the ultrasonic apparatus 500 vibrates the first circuit board 300 in a long side direction while pressing the entire first circuit board 300.

However, the first circuit board 300 may sag in a downward third direction DR3 from a region at (e.g., in or on) which the pad terminal PE and the lead terminal LE are not disposed and do not correspond in the thickness direction (in particular, an edge portion of the panel pad area P_PA). Because the ultrasonic apparatus 500 presses downward, when the first circuit board 300 sags downward from the region, corners of a surface of a region around the boundary may be collapsed or deformed by excessive force and/or stress due to the pressing at the boundary between the central portion and the edge portion of the first circuit board 300. According to an embodiment, however, the dummy pad electrode D_PE and the dummy lead electrode D_LE may be disposed to overlap with each other at (e.g., in or on) an edge region of the first circuit board 300, and may be formed so that the sum of the thicknesses thereof is the same or substantially the same as the sum of the thicknesses of the panel pad electrode P_PE and the first lead electrode LE1 to flatten or substantially flatten the first circuit board 300 as a whole. Accordingly, it may be possible to prevent or at least alleviate a phenomenon in which excessive force and/or stress is concentrated in a specific region by a sagging phenomenon of the specific region of the first circuit board 300 during ultrasonic bonding.

In addition, when the dummy pad electrode D_PE and the dummy lead electrode D_LE are disposed to overlap with each other at the edge portion of the first circuit board 300 and ultrasonic bonding is performed, a bonding force between the first circuit board 300 and the panel pad area P_PA may be increased as a whole to improve the bonding reliability.

Hereinafter, a display apparatus according to another embodiment will be described. The same or substantially the same configurations, components, and layers as those described above are denoted with the same reference symbols in the following embodiment, and thus, redundant description thereof may be simplified or may not be repeated.

Figure 6:
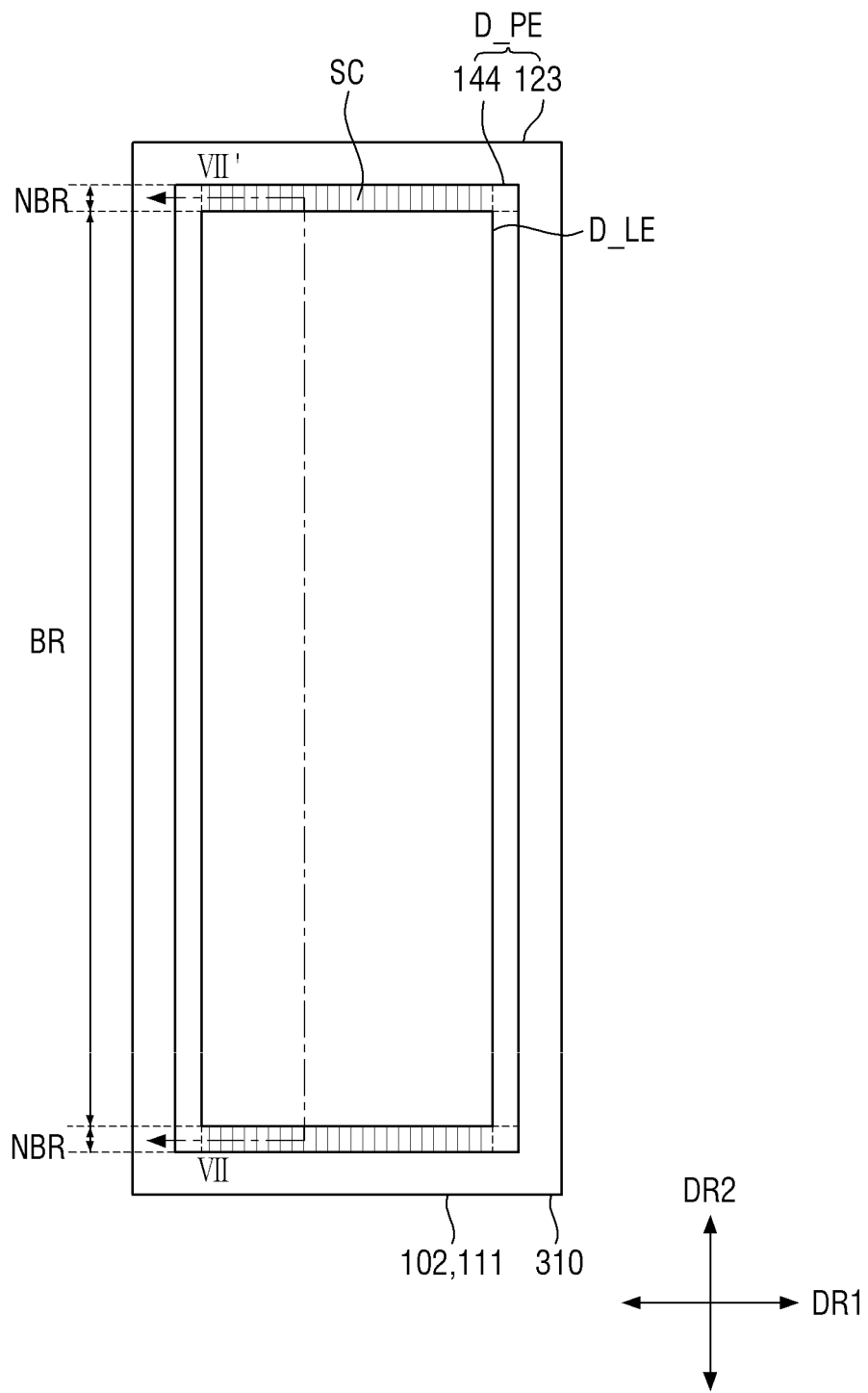
FIG. 6 is a plan view showing a state in which one panel pad terminal and a lead terminal are bonded.

FIG. 6 is a plan view showing a state in which one panel pad terminal and a lead terminal are bonded according to another embodiment.

Figure 7:
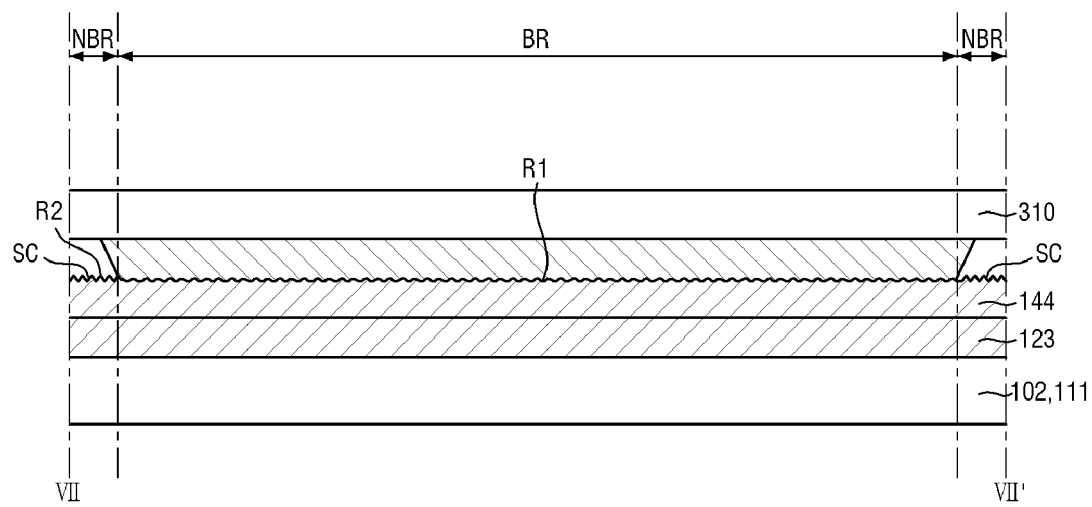
FIG. 7 is a cross-sectional view taken along the line VII-VII' of FIG. 6.

FIG. 7 is a cross-sectional view taken along the line VII-VII' of FIG. 6.

In the embodiment shown in FIGS. 6 and 7, when ultrasonically bonding a first lead terminal LE1 and a panel pad terminal P_PE to each other, and a dummy lead terminal D_LE and a dummy pad terminal D_PE to each other, the pad terminals P_PE and D_PE may have a region BR that is bonded to the lead terminals LE1 and D_LE and a region NBR that is not bonded thereto. In addition, as illustrated, the dummy pad terminal D_PE may include a region BR that is bonded to the dummy lead terminal D_LE, and a region BR that is not bonded thereto. Hereinafter, the dummy lead terminal D_LE and the dummy pad terminal D_PE will be mainly described in more detail, for convenience of description. However, the same or substantially the same description may be applied to the relationship between the first lead terminal LE1 and the panel pad terminal P_PE.

In more detail, when ultrasonically bonding the dummy lead terminal D_LE and the dummy pad terminal D_PE to each other, the pad terminals P_PE and D_PE may have the region BR that is bonded to the lead terminals LE1 and D_LE, and the region NBR that is not bonded thereto.

The bonding region BR and the non-bonding region NBR may be regions of a surface (e.g., one surface) of the dummy pad terminal D_PE on which the dummy lead terminal D_LE rubs. As shown in FIG. 7, the bonding region BR may be the same or substantially the same as a width of one surface of the dummy lead terminal D_LE. However, the present disclosure is not limited thereto, and the bonding region BR may protrude further outward from the one surface of the dummy lead terminal D_LE to be larger than the width of the dummy lead terminal D_LE.

The non-bonding region NBR is a region that is adjacent to opposite ends of the bonding region BR, and is rubbed by the dummy lead terminal D_LE, but may be an area at (e.g., in or on) which the dummy lead terminal D_LE and/or the dummy pad terminal D_PE are not melted.

During the ultrasonic bonding process, the bonding region BR and one surface of the bonding region BR of the dummy pad terminal D_PE are rubbed by the dummy lead terminal D_LE that vibrates in the second direction DR2 from above, and when the dummy pad terminal D_PE is repeatedly rubbed in a constant or substantially constant vibration direction, scratches may be formed in at least some areas thereof.

While the ultrasonic bonding process is performed, the scratches of the bonding region BR may be at least partially filled or covered by the dummy lead terminal D_LE and/or the dummy pad terminal D_PE, which are partially melted at (e.g., in or on) the bonding region BR.

However, even though the ultrasonic bonding process is performed, a scratch SC of the non-bonding region NBR may not be filled or covered, because the dummy lead terminal D_LE and the dummy pad terminal D_PE may not be melted with each other or at least may not be sufficiently melted to be bonded to each other. Accordingly, even though the number of the scratches SC of one surface of the non-bonding region NBR of the dummy pad terminal D_PE is greater than or equal to that of one surface of the bonding region BR, the degree of digging in the thickness direction at the non-bonding region NBR may be large. Therefore, a surface roughness R2 of the one surface of the non-bonding region NBR of the dummy pad terminal D_PE may be greater than a surface roughness R1 of the one surface of the bonding region BR.

Figure 8:
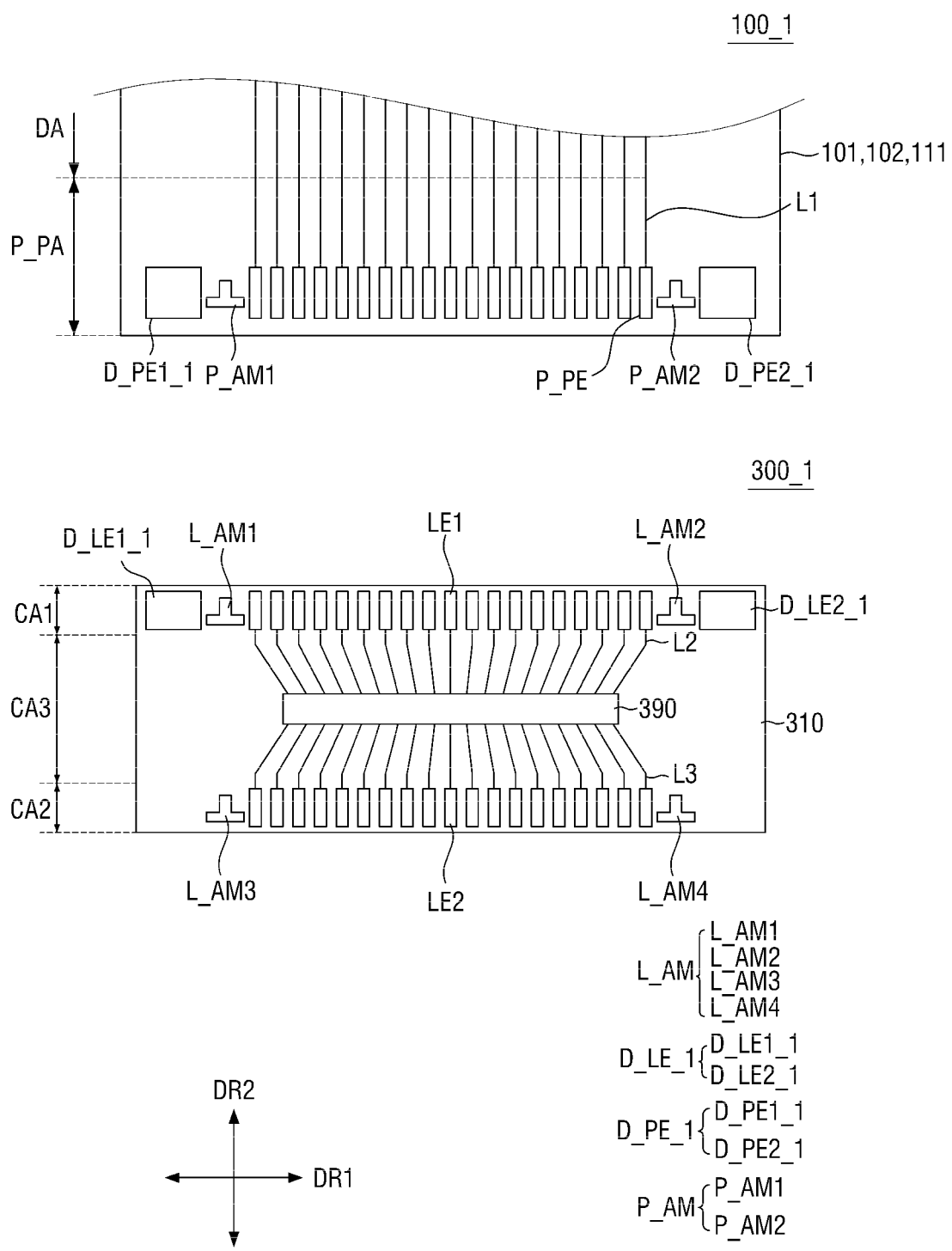
FIG. 8 is a plan layout view of a panel pad area and a first circuit board according to another embodiment.
Figure 9:
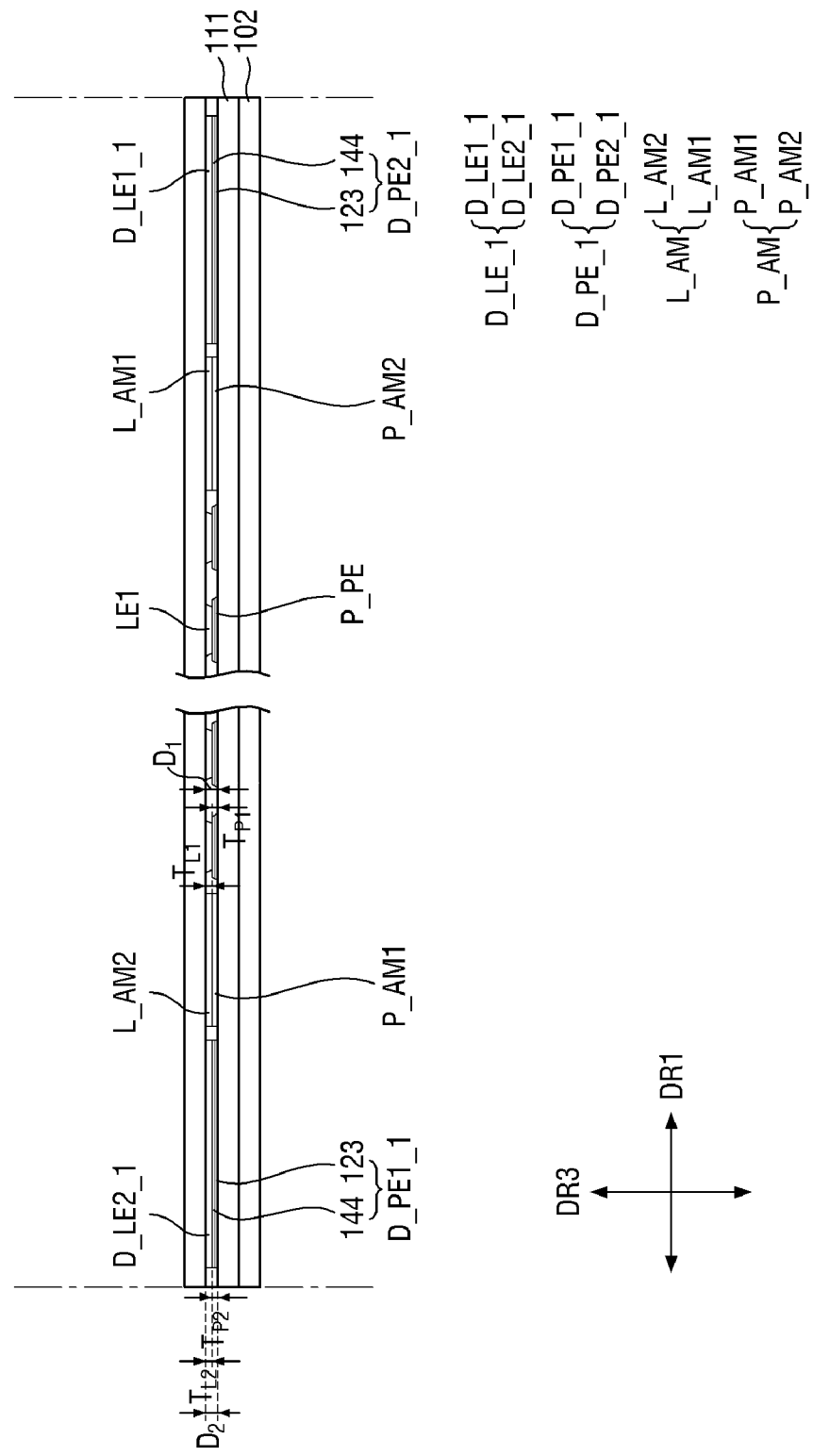
FIG. 9 is a cross-sectional view of a display apparatus according to another embodiment.

FIG. 8 is a plan layout view of a panel pad area and a first circuit board according to another embodiment, and FIG. 9 is a cross-sectional view of a display panel according to another embodiment.

Referring to FIGS. 8 and 9, a display apparatus 2 according to the present embodiment may be different from the display apparatus 1 according to one or more of the above described embodiments in that a dummy pad terminal D_PE_1 and a dummy lead terminal D_LE_1 have a cylindrical pattern shape.

In more detail, the dummy pad terminal D_PE_1 and the dummy lead terminal D_LE_1 may have the cylindrical pattern shape. In a conductive layer including the dummy pad terminal D_PE_1 and the dummy lead terminal D_LE_1, a plurality of dummy pad terminals D_PE_1 and dummy lead terminals D_LE_1 may be formed by a photoresist process, and when the dummy pad terminal D_PE_1 and the dummy lead terminal D_LE_1 have the cylindrical pattern shape, such an additional process may not be required, and thus, the process may be simplified.

In addition, when the dummy pad terminal D_PE_1 and the dummy lead terminal D_LE_1 have the cylindrical pattern shape, a contact area between the dummy pad terminal D_PE_1 and the dummy lead terminal D_LE_1 is increased during the ultrasonic bonding, so that the bonding force in the corresponding region may be increased as compared to when having the patterned terminals.

Figure 10:
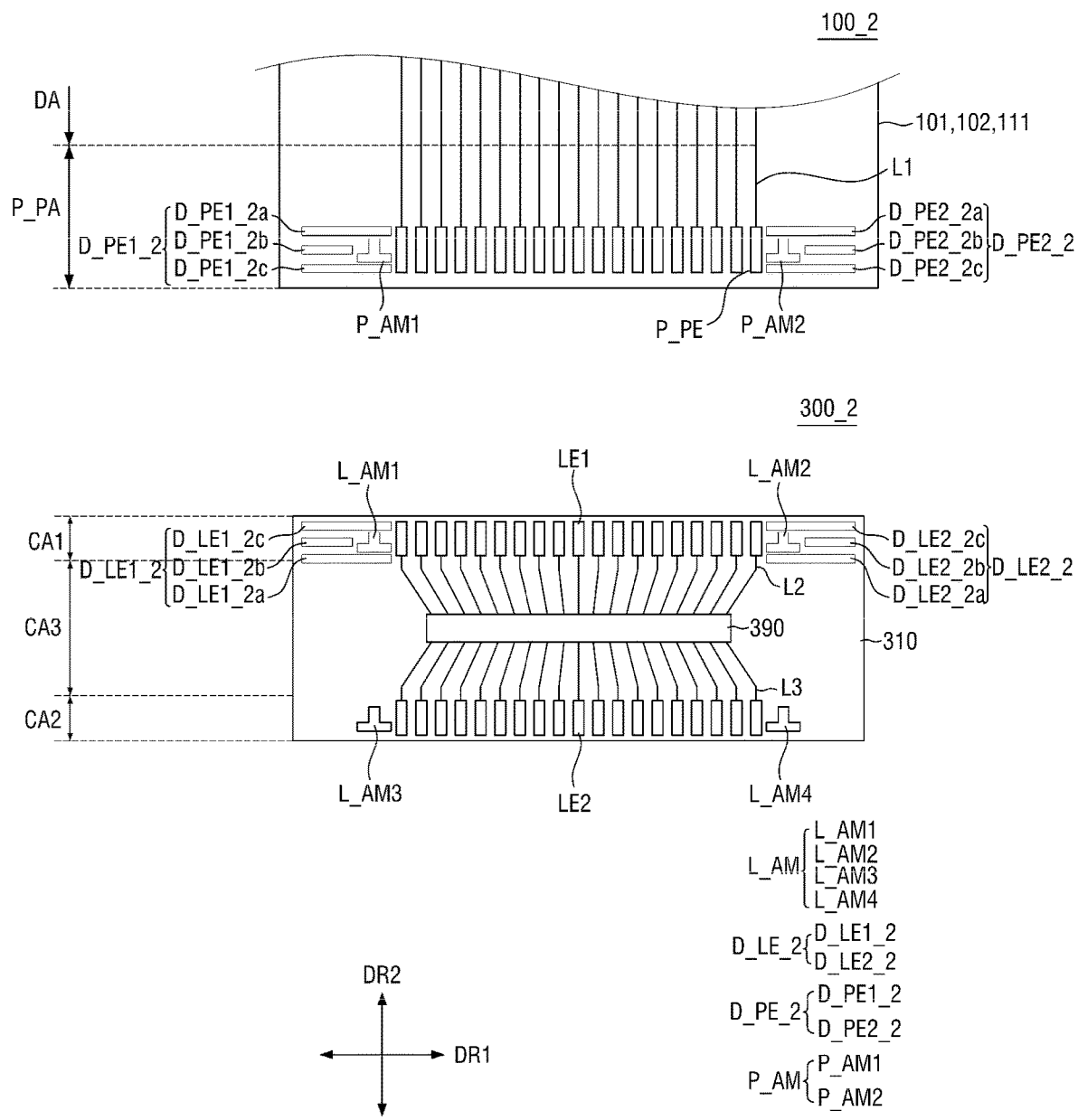
FIG. 10 is a plan layout view of a panel pad area and a first circuit board according to another embodiment.
Figure 11:
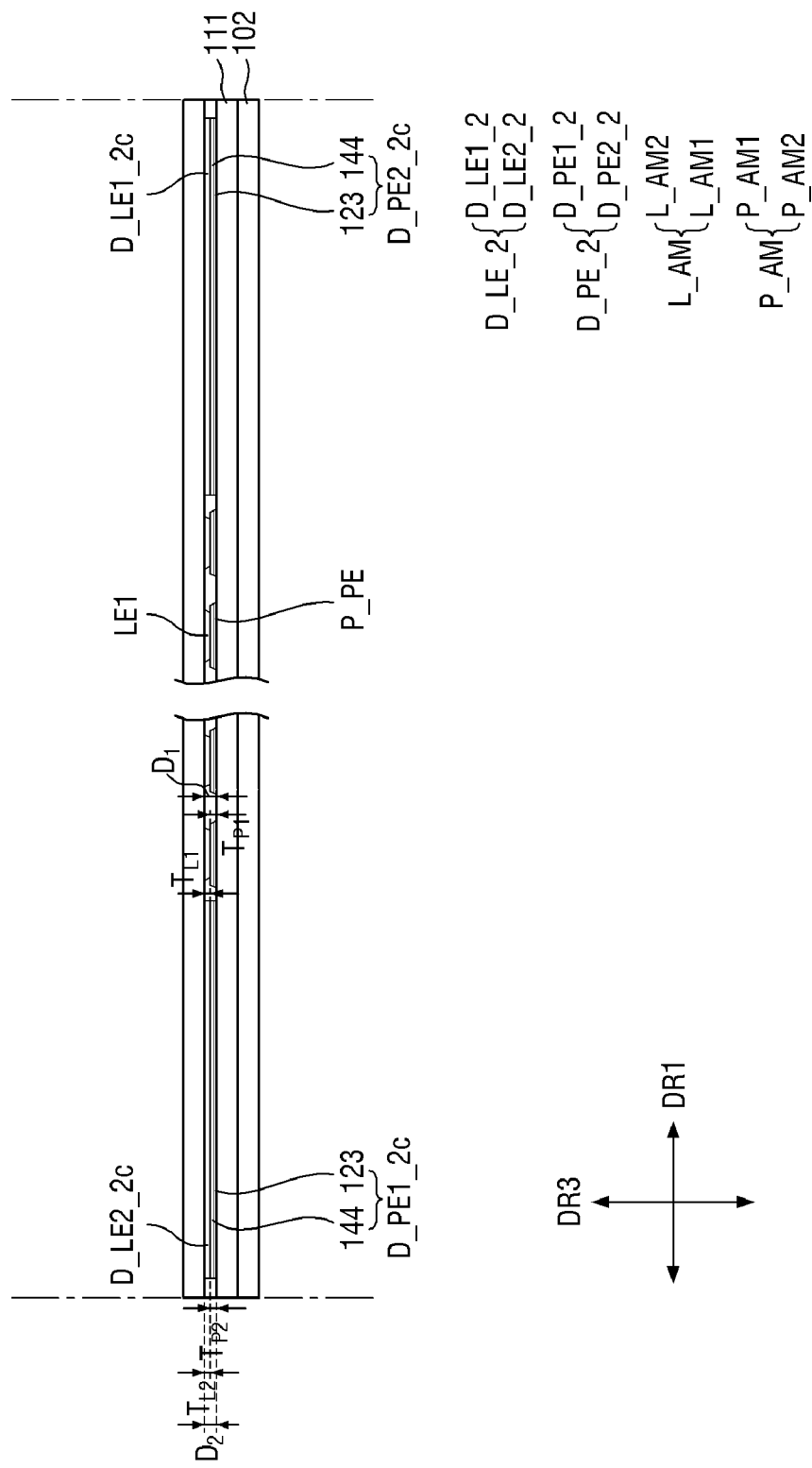
FIG. 11 is a cross-sectional view of a display apparatus according to another embodiment.

FIG. 10 is a plan layout view of a panel pad area and a first circuit board according to another embodiment, and FIG. 11 is a cross-sectional view of a display panel according to another embodiment.

Referring to FIGS. 10 and 11, a display apparatus 3 according to the present embodiment may be different from one or more embodiments described above, in that a dummy pad terminal D_PE_2 and a dummy lead terminal D_LE_2 have long sides in a first direction DR2 and short sides in a second direction DR1.

In more detail, in the display apparatus 3 according to the present embodiment, the dummy pad terminal D_PE_2 and the dummy lead terminal D_LE_2 may have the long sides in the first direction DR1 and the short sides in the second direction DR2.

In addition, the dummy pad terminal D_PE_2 according to the present embodiment may include a first sub-panel terminal D_PE1_2a and a third sub-panel terminal D_PE1_2c overlapping with a panel alignment mark P_AM in the second direction DR2, and a second sub-panel terminal D_PE1_2b overlapping with the panel alignment mark P_AM in the first direction DR1. Although only one first sub-panel terminal D_PE1_2a is illustrated in FIG. 10, the present disclosure is not limited thereto, and the first sub-panel terminal D_PE1_2a may include a plurality of first sub-panel terminals D_PE1_2a that are spaced apart from each other in the second direction DR2.

Similarly, the dummy lead terminal D_LE_2 may include a first sub dummy lead terminal D_LE1_2a and a third sub dummy lead terminal D_LE1_2c overlapping with a lead alignment mark L_AM in the second direction DR2, and a second sub dummy lead terminal D_LE1_2b overlapping with the lead alignment mark L_AM in the first direction DR1. Although only one first sub dummy lead terminal D_LE1_2a is illustrated in FIG. 10, the present disclosure is not limited thereto, and the first sub dummy lead terminal D_LE1_2a may include a plurality of first sub dummy lead terminals D_LE1_2a that are spaced apart from each other in the second direction DR2.

In the dummy pad terminal D_PE_2 and the dummy lead terminal D_LE_2 according to the present embodiment, a bonding force between a display panel 100_2 and a first circuit board 300_2 may be increased at (e.g., in or on) an edge region of the base substrate 101, and in addition, the bonding force between the display panel 100_2 and the first circuit board 300_2 may be increased even in a region overlapping with the panel and lead alignment marks P_AM and L_AM in the second direction DR2.

Figure 12:
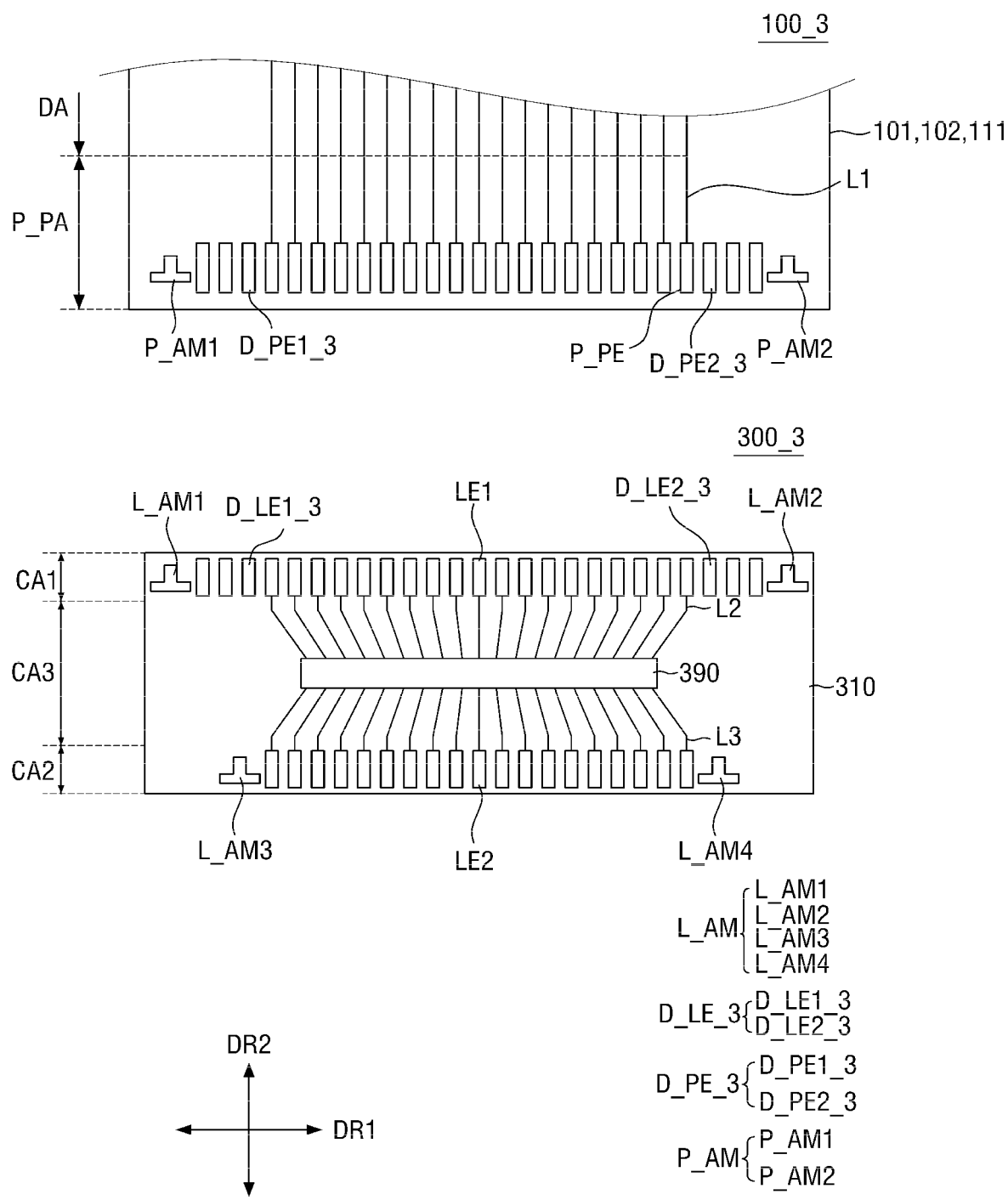
FIG. 12 is a plan layout view of a panel pad area and a first circuit board according to another embodiment.
Figure 13:
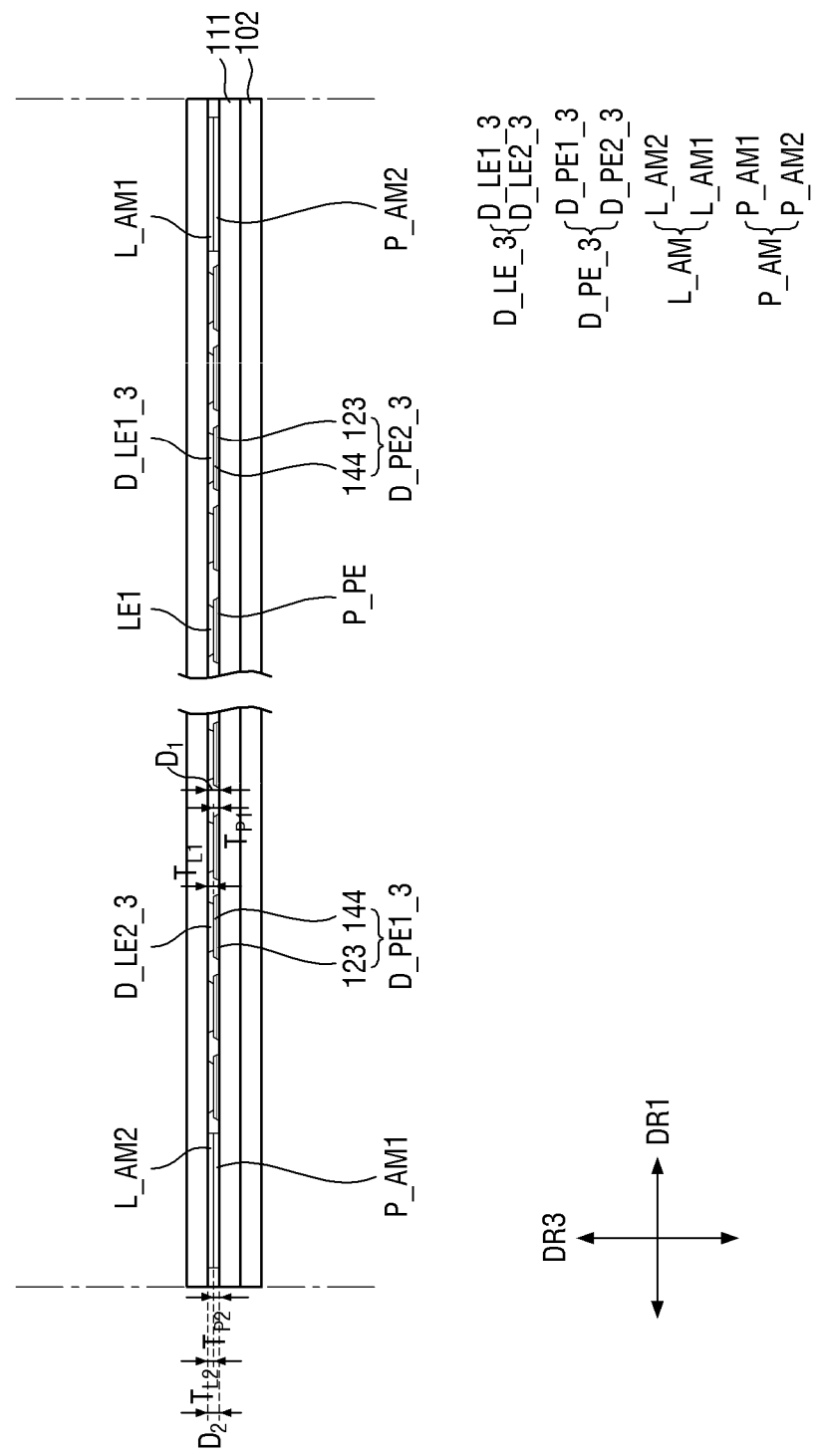
FIG. 13 is a cross-sectional view of a display apparatus according to another embodiment.

FIG. 12 is a plan layout view of a panel pad area and a first circuit board according to another embodiment, and FIG. 13 is a cross-sectional view of a display panel according to another embodiment.

Referring to FIGS. 12 and 13, a display apparatus 4 according to the present embodiment may be different from the display apparatus 1 according to one or more embodiments described above, in that positions of a panel alignment mark P_AM and a dummy pad terminal D_PE_3, and a lead alignment mark L_AM and a dummy lead terminal D_LE_3 are exchanged (e.g., are switched).

In more detail, the panel alignment mark P_AM according to the present embodiment may be positioned at an edge region of the base substrate 101, and the dummy pad terminal D_PE_3 may be disposed between the panel alignment mark P_AM and the panel pad terminal P_PE.

Similarly, the lead alignment mark L_AM may be positioned at the edge region of the base substrate 101, and the dummy lead terminal D_LE_3 may be disposed between the lead alignment mark L_AM and the first lead terminal LE1.

According to the present embodiment, the dummy pad terminal D_PE_3 may be disposed to be adjacent to the panel pad terminal P_PE, and the dummy lead terminal D_LE_3 may be disposed to be adjacent to the first lead terminal LE1.

Figure 14:
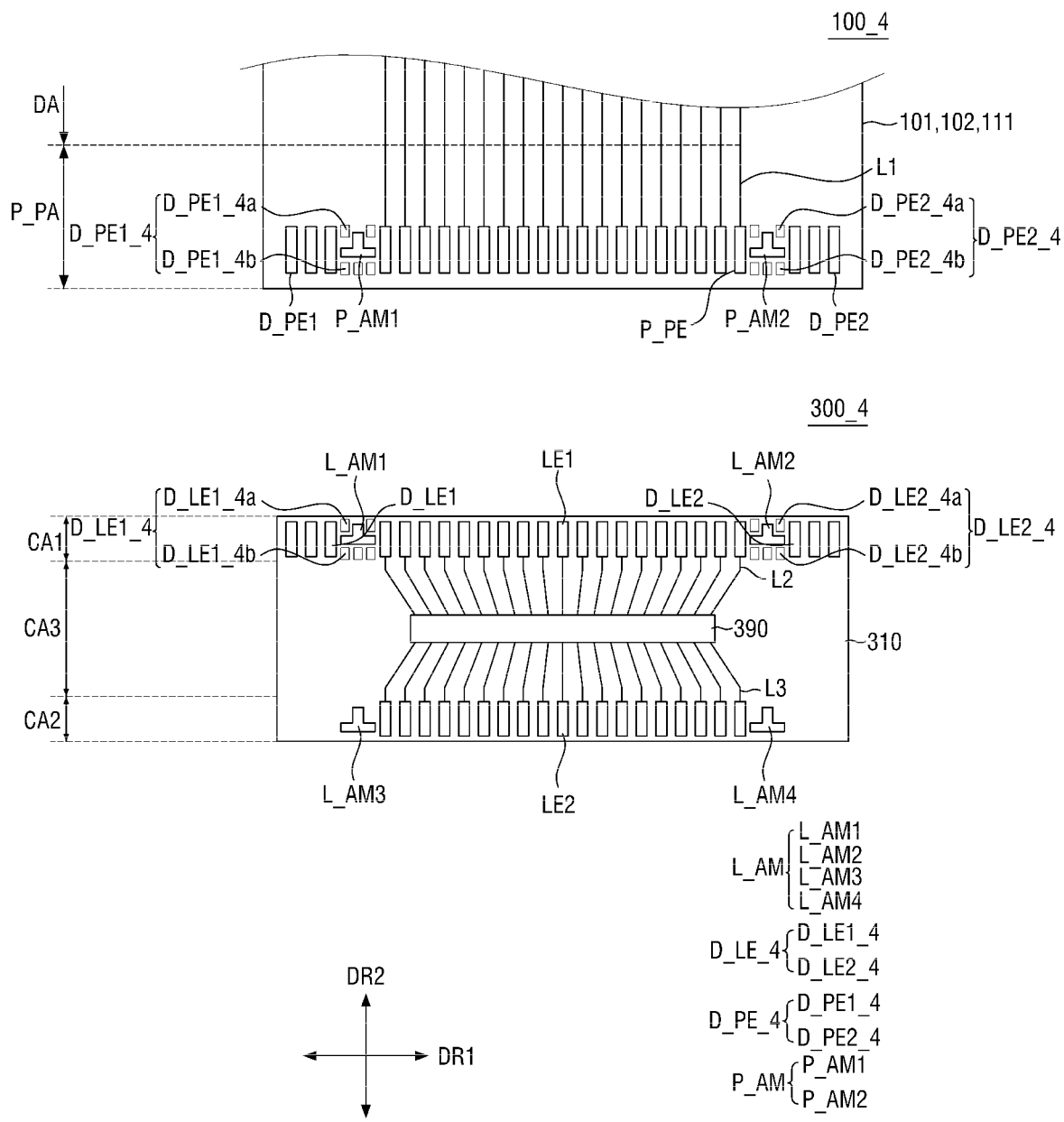
FIG. 14 is a plan layout view of a panel pad area and a first circuit board according to another embodiment.
Figure 15:
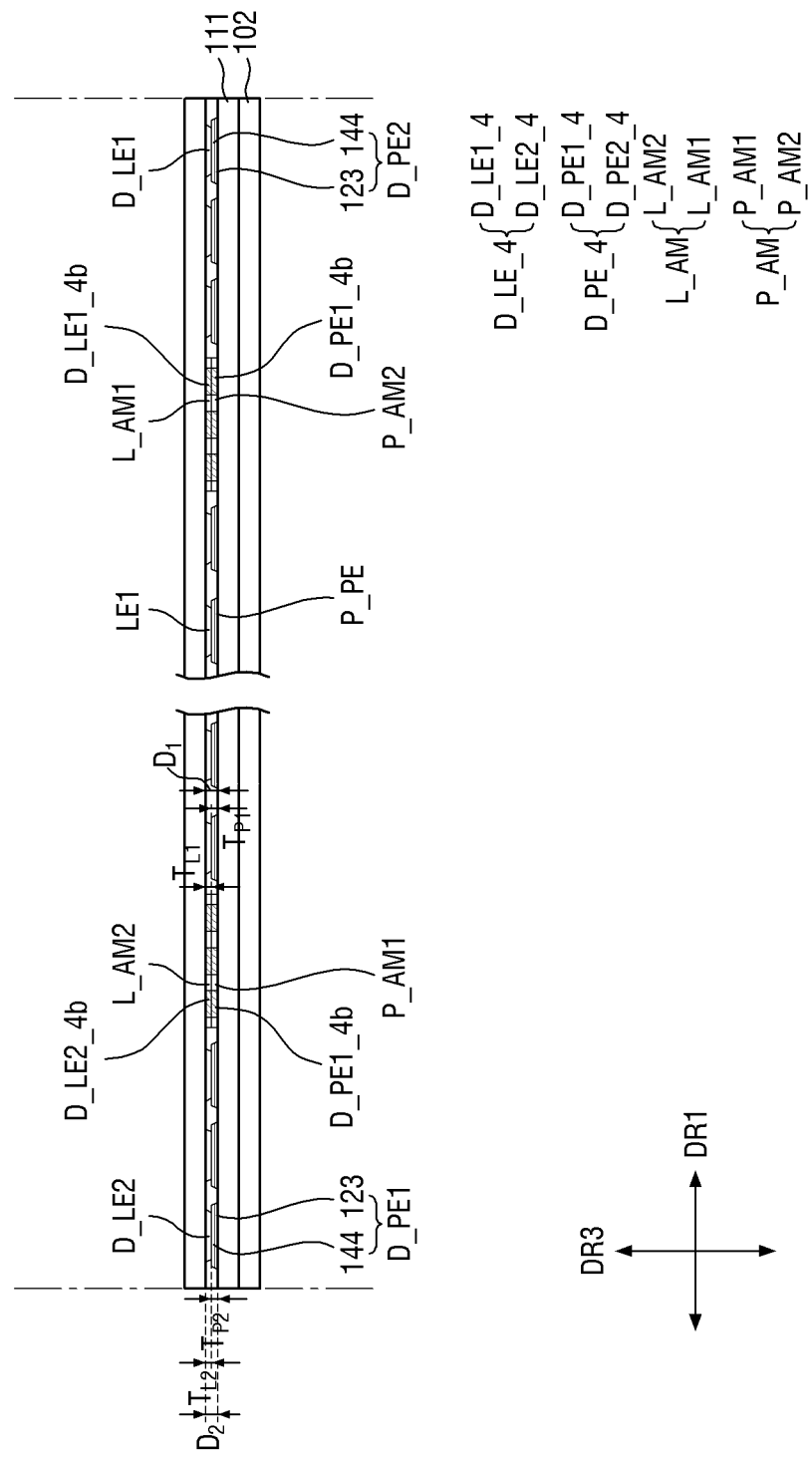
FIG. 15 is a cross-sectional view of a display apparatus according to another embodiment.

FIG. 14 is a plan layout view of a panel pad area and a first circuit board according to another embodiment, and FIG. 15 is a cross-sectional view of a display panel according to another embodiment.

Referring to FIGS. 14 and 15, a display apparatus 5 according to the present embodiment may be different from the display apparatus 1 according to one or more of the above described embodiments, in that a dummy pad terminal D_PE_4 overlapping with a panel alignment mark P_AM in a second direction DR2 and having a long side in the second direction DR2 is disposed above and/or below the panel alignment mark P_AM in the second direction DR2, and a dummy lead terminal D_LE_4 overlapping with a lead alignment mark L_AM in the second direction DR2 and having a long side in the second direction DR2 is disposed above and/or below the lead alignment mark L_AM in the second direction DR2.

In more detail, the dummy pad terminal D_PE_4 according to the present embodiment may further include dummy pad terminals D_PE_4a and D_PE_4b overlapping with the panel alignment mark P_AM in the second direction DR2, having long sides in the second direction DR2, and disposed above and/or below the panel alignment mark P_AM in the second direction DR2, in addition to the dummy pad terminal D_PE.

Similarly, the dummy lead terminal D_LE_4 may further include dummy lead terminals D_LE_4a and D_LE_4b overlapping with the lead alignment mark L_AM in the second direction DR2, having long sides in the second direction DR2, and disposed above and/or below the lead alignment mark L_AM in the second direction DR2, in addition to the dummy lead terminal D_LE.

Figure 17:
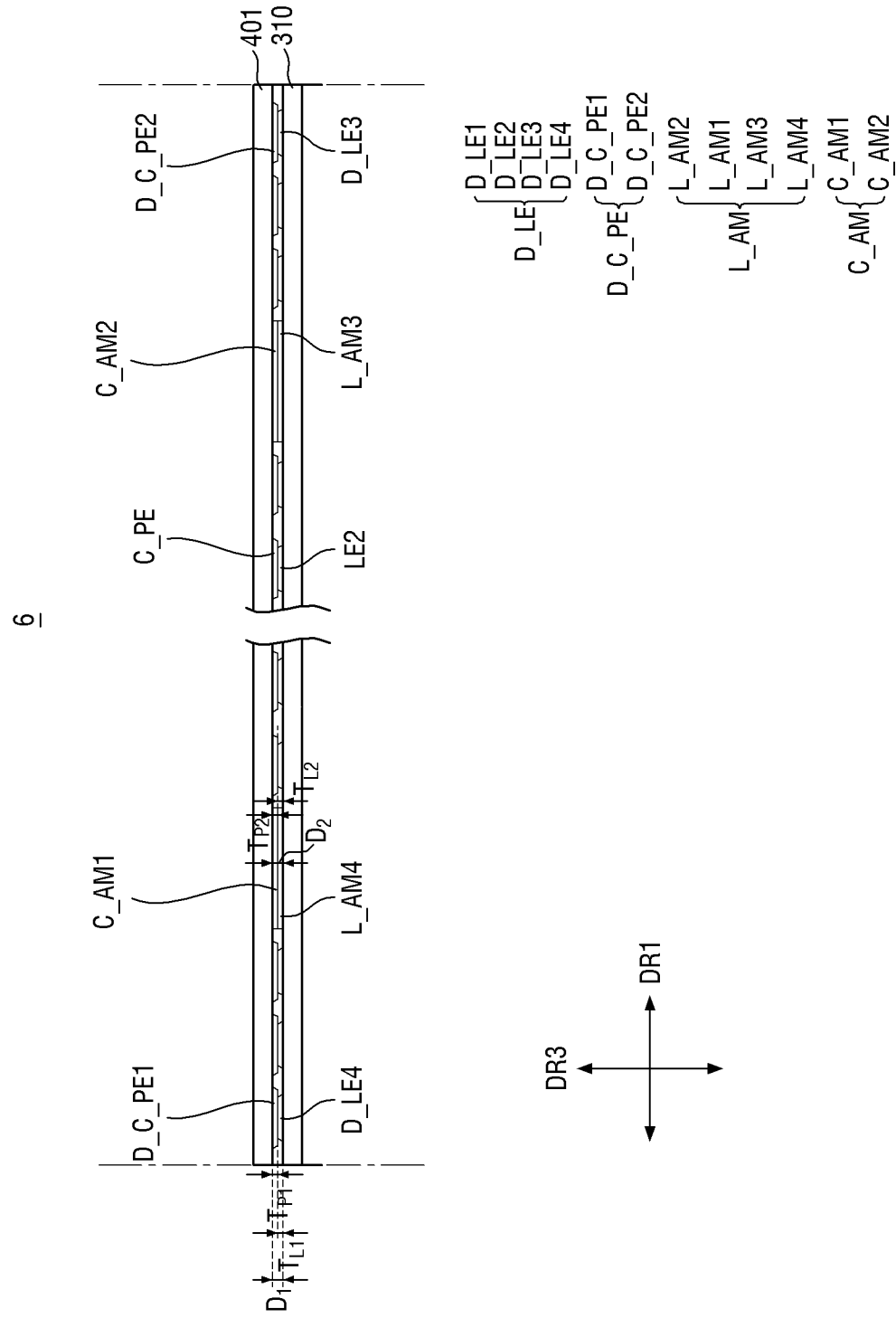
FIG. 17 is a cross-sectional view of a display apparatus according to another embodiment.

FIG. 16 is a plan layout view of first and second circuit boards according to another embodiment, and FIG. 17 is a cross-sectional view of a display apparatus according to another embodiment.

Referring to FIGS. 16 and 17, a first circuit board 300_5 according to the present embodiment may be different from the display apparatus 1 according to one or more embodiments described above, in that dummy lead terminals D_LE3 and D_LE4 are further included at (e.g., in or on) a second circuit area CA2, and a second circuit board 400_1 further includes a circuit alignment mark C_AM and a dummy circuit pad terminal D_C_PE on one surface of a base circuit board 401.

The shape and material of the third dummy lead terminal D_LE3 and the fourth dummy lead terminal D_LE4 are the same or substantially the same as those of the dummy lead terminal D_LE1, according to an embodiment.

A circuit pad terminal C_PE may include one or more materials selected from among the above described materials of the panel pad terminal P_PE. The circuit pad terminal C_PE may be disposed at a central portion of a circuit pad region C_PA. Although not shown in the drawings, the circuit pad terminal C_PE may be electrically connected to a control unit (e.g., a controller) included at (e.g., in or on) the second circuit board 400_1.

The circuit pad terminal C_PE may have the same or substantially the same planar shape as that of the panel pad terminal P_PE described above. However, planar sizes of the lead terminals LE1 and LE2 may be smaller than a planar size of the circuit pad terminal C_PE.

The circuit alignment mark C_AM may include first and second circuit alignment marks C_AM1 and C_AM2. The circuit alignment marks C_AM1 and C_AM2 may be disposed to be spaced apart from each other with the circuit pad terminal C_PE therebetween.

The circuit alignment marks C_AM1 and C_AM2 may be disposed at (e.g., in or on) opposite sides of the circuit pad terminal C_PE, respectively, and may mark the circuit pad terminal C_PE. In addition, the circuit alignment mark C_AM may be disposed to overlap with the lead alignment mark L_AM in a thickness direction (e.g., the third direction DR3), and may align the second lead terminal LE2 to correspond to the circuit pad terminal C_PE in the thickness direction.

The circuit alignment mark C_AM may have a stacked structure that is the same or substantially the same as (or similar to) that of the circuit pad terminal C_PE, and may be made of the same or substantially the same material.

As shown in FIG. 16, the circuit alignment mark C_AM may have the same or substantially the same shape as that of the lead alignment mark L_AM described above. However, the present disclosure is not limited thereto, and the circuit alignment mark C_AM may have a shape that is different from that of the lead alignment mark L_AM. Even in this case, however, the circuit alignment mark C_AM may have a suitable shape so as to be aligned with the lead alignment mark L_AM.

Although one first circuit alignment mark C_AM1 and one second circuit alignment mark C_AM2 are illustrated in FIG. 16, the present disclosure is not limited thereto, and there may be two or more of each of the first circuit alignment mark C_AM1 and the second circuit alignment mark C_AM2.

Unlike the circuit pad terminal C_PE, the circuit alignment mark C_AM may be floated (e.g., may be electrically floated).

The dummy circuit pad terminal D_C_PE may be disposed to be adjacent to a short side of the circuit base substrate 401 (e.g., an edge of the circuit base substrate 401). The dummy circuit pad terminal D_C_PE may include a first dummy circuit pad terminal D_C_PE1 disposed between the first circuit alignment mark C_AM1 and one short side of the circuit base substrate 401, and a second dummy circuit pad terminal D_C_PE2 disposed between the second circuit alignment mark C_AM2 and the other short side of the circuit base substrate 401. The dummy circuit pad terminal D_C_PE may be disposed to be spaced apart from the circuit pad terminal C_PE with the circuit alignment mark C_AM therebetween.

The dummy circuit pad terminal D_C_PE may have the same or substantially the same planar shape as that of the circuit pad terminal C_PE described above, but the present disclosure is not limited thereto.

Although three first dummy circuit pad terminals D_C_PE1 and three second dummy circuit pad terminals D_C_PE2 are shown in FIGS. 16 and 17, the present disclosure is not limited thereto, and the number of each of the first and second dummy circuit pad terminals D_C_PE1 and D_C_PE2 may be two, four, or more.

Unlike the circuit pad terminal C_PE, the dummy circuit pad terminal D_C_PE may be floated (e.g., may be electrically floated).

In the present embodiment, the second lead terminal LE2 may be directly coupled to the circuit pad terminal C_PE by ultrasonic bonding. The dummy circuit pad terminal D_C_PE may also be directly coupled to the dummy lead terminal D_LE by the ultrasonic bonding.

The above description has been focused on the presented embodiments, but it is merely illustrative and does not limit the present disclosure. It will be apparent to those skilled in the art that various modifications and applications that are not illustrated above may be possible without departing from the spirit and scope of the present disclosure. For example, elements of the embodiments described herein may be variously modified and realized. In addition, it should be construed that differences related to such modifications and applications are included in the spirit and scope of the present disclosure as defined in the appended claims, and their equivalents.

DESCRIPTION OF REFERENCE SYMBOLS

100: Display panel
200: Panel lower sheet
300: First circuit board
400: Second circuit board

The invention claimed is:

1. A display apparatus comprising:
a display panel comprising a display area, and a pad area adjacent to the display area; and
a circuit board attached to the pad area,
wherein the pad area comprises at least one signal pad terminal electrically connected to a first signal line extending through the display area, and at least one dummy pad terminal spaced from the first signal line, and
the circuit board comprises a signal lead terminal connected to the signal pad terminal, and a dummy lead terminal connected to the dummy pad terminal.

2. The display apparatus of claim 1, wherein the circuit board further comprises a driving integrated circuit, and a second signal line electrically connecting the driving integrated circuit and the signal lead terminal to each other.

3. The display apparatus of claim 2, wherein the dummy pad terminal is spaced from the driving integrated circuit.

4. The display apparatus of claim 3, wherein the signal pad terminal and the dummy pad terminal are directly connected to each other.

5. The display apparatus of claim 1, wherein the signal pad terminal comprises a plurality of signal pad terminals, and the plurality of signal pad terminals are arranged along a first direction.

6. The display apparatus of claim 5, wherein the at least one dummy pad terminal comprises a first dummy pad terminal located at one side of an array of the plurality of signal pad terminals in the first direction.

7. The display apparatus of claim 6, wherein the at least one dummy pad terminal further comprises a second dummy pad terminal located at an opposite side of the array of the plurality of signal pad terminals in the first direction.

8. The display apparatus of claim 7, wherein the display panel further comprises a first pad alignment mark between the array of the plurality of signal pad terminals and the first dummy pad terminal, and a second pad alignment mark between the array of the plurality of signal pad terminals and the second dummy pad terminal, and
wherein the first and second pad alignment marks have a shape that is different from that of the signal pad terminal.

9. The display apparatus of claim 8, wherein the circuit board comprises a first lead alignment mark directly connected to the first pad alignment mark, and a second lead alignment mark directly connected to the second pad alignment mark.

10. The display apparatus of claim 9, wherein a planar size of the first pad alignment mark is the same as that of the first lead alignment mark, and a planar size of the second pad alignment mark is the same as that of the second lead alignment mark.

11. The display apparatus of claim 1, wherein the dummy pad terminal comprises a first material selected from among Ti/Al/Ti, Mo/Al/Mo, Mo/AlGe/Mo, and Ti/Cu.

12. The display apparatus of claim 11, wherein the dummy lead terminal comprises a second material selected from among Ag, Au, and Cu.

13. The display apparatus of claim 12, further comprising a region between the dummy pad terminal and the dummy lead terminal where the first material and the second material are mixed with each other.

14. The display apparatus of claim 1, wherein a sum of a thickness of the signal pad terminal and a thickness of the signal lead terminal is equal to a sum of a thickness of the dummy pad terminal and a thickness of the dummy lead terminal.

15. The display apparatus of claim 1, wherein a planar size of the dummy pad terminal is larger than a planar size of the dummy lead terminal.

16. The display apparatus of claim 1, wherein the dummy pad terminal comprises a first area overlapping with the dummy lead terminal in a thickness direction, and a second area adjacent to the first area.

17. The display apparatus of claim 16, wherein the dummy pad terminal and the dummy lead terminal are directly connected to each other at the first area.

18. The display apparatus of claim 17, wherein the dummy pad terminal and the dummy lead terminal are ultrasonically bonded to each other at the first area.

19. The display apparatus of claim 16, wherein one surface of the dummy pad terminal facing the circuit board comprises a scratch at the second area.

20. The display apparatus of claim 19, wherein a first roughness of the one surface of the first area of the dummy pad terminal is smaller than a second roughness of the one surface of the second area of the dummy pad terminal.

* * * * *